United States Patent
Attal et al.

(10) Patent No.: US 11,689,147 B2
(45) Date of Patent: Jun. 27, 2023

(54) PHOTOVOLTAIC MODULE MOUNTING STRUCTURE

(71) Applicant: Parasol Structures Inc., Irvington, NY (US)

(72) Inventors: Francois Attal, Brooklyn, NY (US); Brian Cuff, Irvington, NY (US); Hikaru Iwasaka, New York, NY (US); Alexander Keller, Winchester, MA (US)

(73) Assignee: Parasol Structures Inc., Irvington, NY (US)

( * ) Notice: Subject to any disclaimer, the term of this patent is extended or adjusted under 35 U.S.C. 154(b) by 82 days.

(21) Appl. No.: 17/406,778

(22) Filed: Aug. 19, 2021

(65) Prior Publication Data

US 2022/0060140 A1 Feb. 24, 2022

Related U.S. Application Data

(60) Provisional application No. 63/068,017, filed on Aug. 20, 2020.

(51) Int. Cl.
*H02S 20/10* (2014.01)
*H02S 30/10* (2014.01)
(Continued)

(52) U.S. Cl.
CPC ............... *H02S 20/10* (2014.12); *E04B 1/18* (2013.01); *E04H 6/025* (2013.01); *F24S 25/12* (2018.05);
(Continued)

(58) Field of Classification Search
CPC . Y02E 10/50; F24S 25/12; F24S 25/63; F24S 25/61; F24S 2025/6003; H02S 20/10; H02S 40/22; E04H 6/025; H01L 31/0684
See application file for complete search history.

(56) References Cited

U.S. PATENT DOCUMENTS 8,109,048 B2 2/2012 West et al.
8,667,748 B2 3/2014 Belikoff et al.
(Continued)

FOREIGN PATENT DOCUMENTS

CN 111042448 A 4/2020
CN 212836973 U 3/2021
(Continued)

OTHER PUBLICATIONS

International Search Report and Written Opinion in PCT Appl. No. PCT/US2021/046650 dated Dec. 23, 2021, 12 pages.

*Primary Examiner* — Brian E Glessner
*Assistant Examiner* — Daniel J Kenny
(74) *Attorney, Agent, or Firm* — Kowert, Hood, Munyon, Rankin & Goetzel, P.C.; Gareth M. Sampson; Dean M. Munyon

(57) ABSTRACT

Various embodiments of mounting structures for solar photovoltaic (PV) modules and methods for constructing such mounting structures are described. A mounting structure is usable to secure PV modules in portrait orientation or landscape orientation. PV modules are secured to PV module support rails, which may be secured to purlins of a mounting structure using clamps. In some embodiments, self-adhesive grounding patches are used to establish electrical grounding paths in various embodiments of mounting structure.

9 Claims, 21 Drawing Sheets

(51) Int. Cl.
   *H02S 40/22*   (2014.01)
   *H02S 40/34*   (2014.01)
   *H01L 31/068*  (2012.01)
   *H02S 10/00*   (2014.01)
   *E04B 1/18*    (2006.01)
   *E04H 6/02*    (2006.01)
   *F24S 25/61*   (2018.01)
   *F24S 25/63*   (2018.01)
   *F24S 25/12*   (2018.01)
   *F24S 25/60*   (2018.01)

(52) U.S. Cl.
   CPC ............... *F24S 25/61* (2018.05); *F24S 25/63* (2018.05); *H01L 31/0684* (2013.01); *H02S 10/00* (2013.01); *H02S 30/10* (2014.12); *H02S 40/22* (2014.12); *H02S 40/34* (2014.12); *F24S 2025/6003* (2018.05)

(56)              References Cited

U.S. PATENT DOCUMENTS

| | | |
|---|---|---|
| 8,832,938 B2 | 9/2014 | Gies et al. |
| 9,175,881 B2 | 11/2015 | Schrock et al. |
| 2010/0000596 A1* | 1/2010 | Mackler ............... H02S 40/32 136/246 |
| 2010/0132769 A1* | 6/2010 | Potter .................. F24S 25/12 136/251 |
| 2010/0275975 A1 | 11/2010 | Monschke et al. |
| 2012/0090665 A1* | 4/2012 | Zuritis .................. F16B 7/105 211/41.18 |
| 2012/0124922 A1* | 5/2012 | Cusson ................ F24S 25/634 52/645 |
| 2013/0167907 A1 | 7/2013 | Bitarchas et al. |
| 2014/0196767 A1 | 7/2014 | Houle et al. |
| 2015/0000725 A1 | 1/2015 | Reilly et al. |
| 2016/0020351 A1 | 1/2016 | Castillo-Aguilella et al. |
| 2016/0190974 A1 | 6/2016 | Dickey et al. |
| 2016/0285408 A1 | 9/2016 | Ash et al. |
| 2017/0005613 A1 | 1/2017 | Yang et al. |
| 2018/0248508 A1* | 8/2018 | Keller ................... H02S 40/34 |
| 2019/0386601 A1 | 12/2019 | Keller et al. |
| 2020/0036325 A1* | 1/2020 | Poivet ................... H02S 30/20 |
| 2020/0153380 A1 | 5/2020 | Hildebrandt et al. |

FOREIGN PATENT DOCUMENTS

| | | |
|---|---|---|
| EP | 3415837 A1 | 12/2018 |
| JP | 5563362 B2 | 7/2014 |
| JP | 2015122944 A | 7/2015 |
| WO | 201475746 A1 | 5/2014 |

* cited by examiner

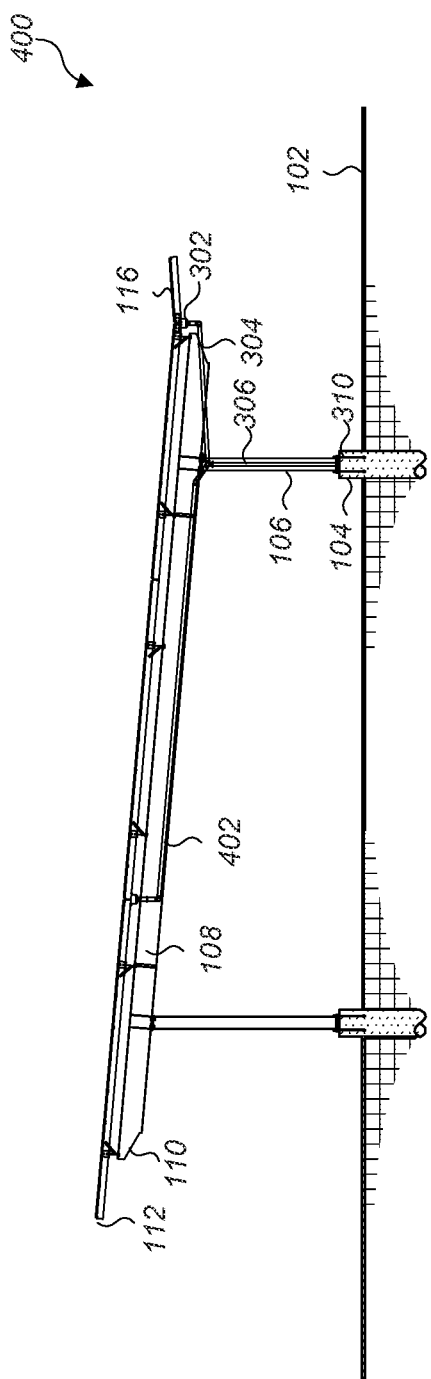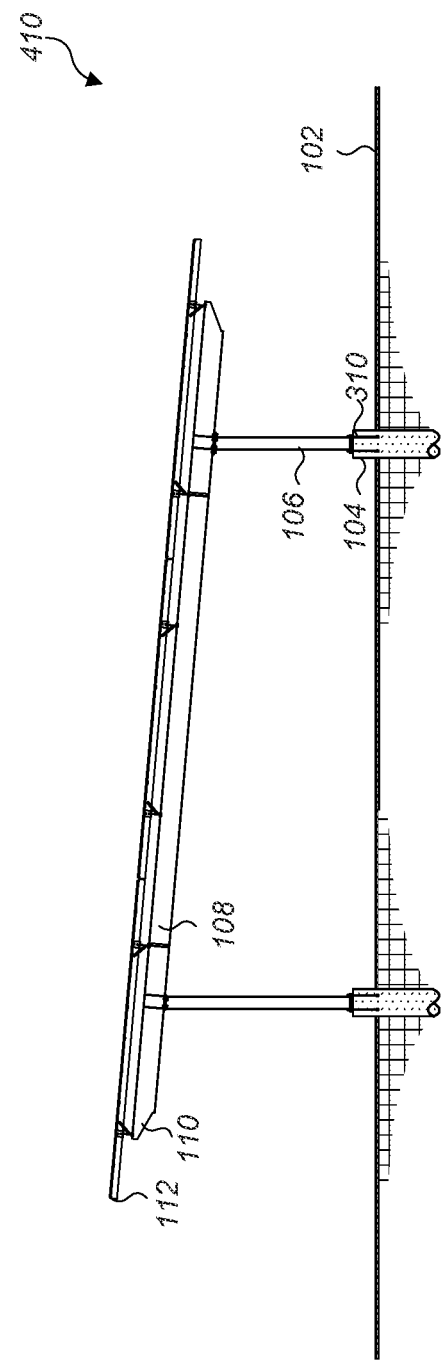

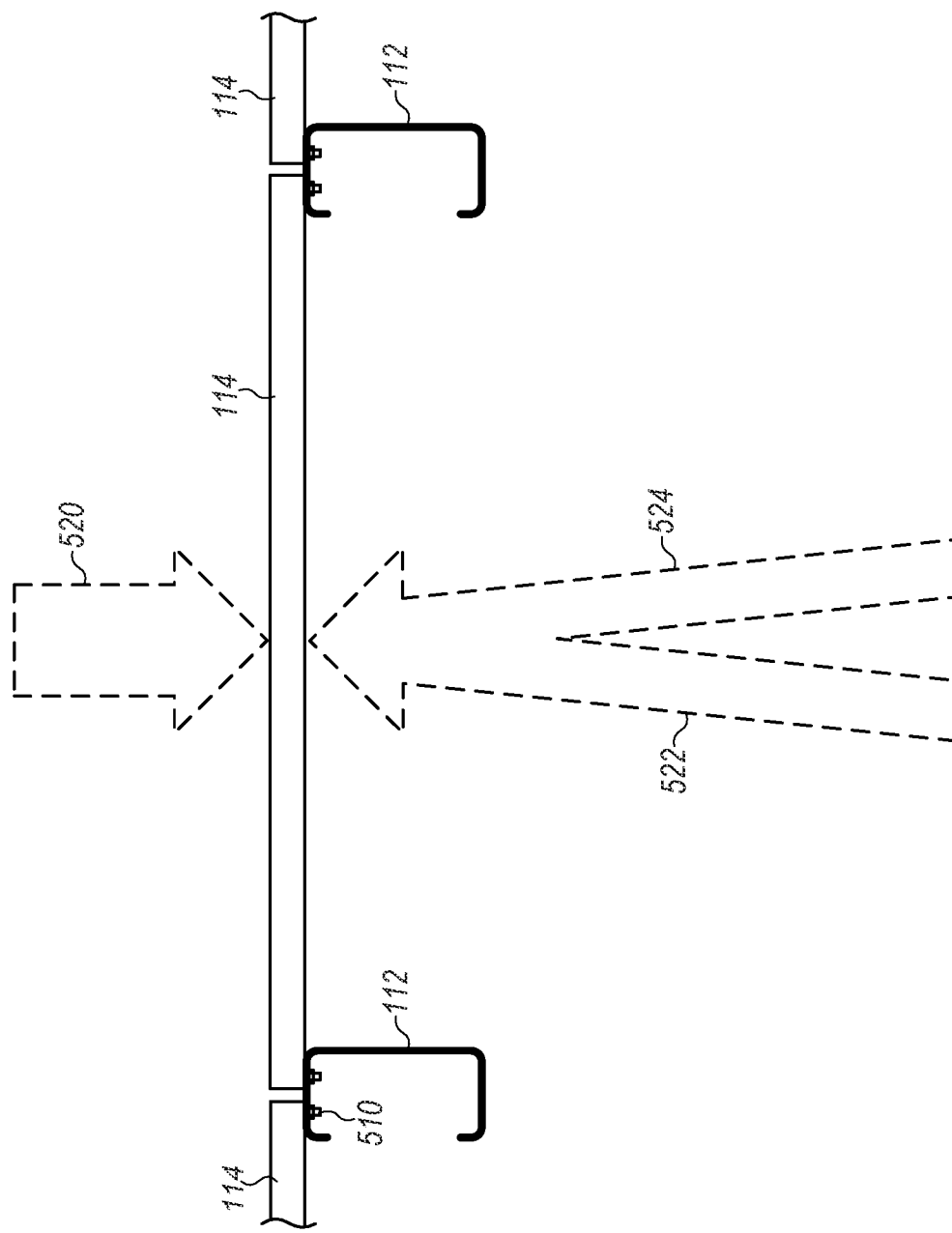

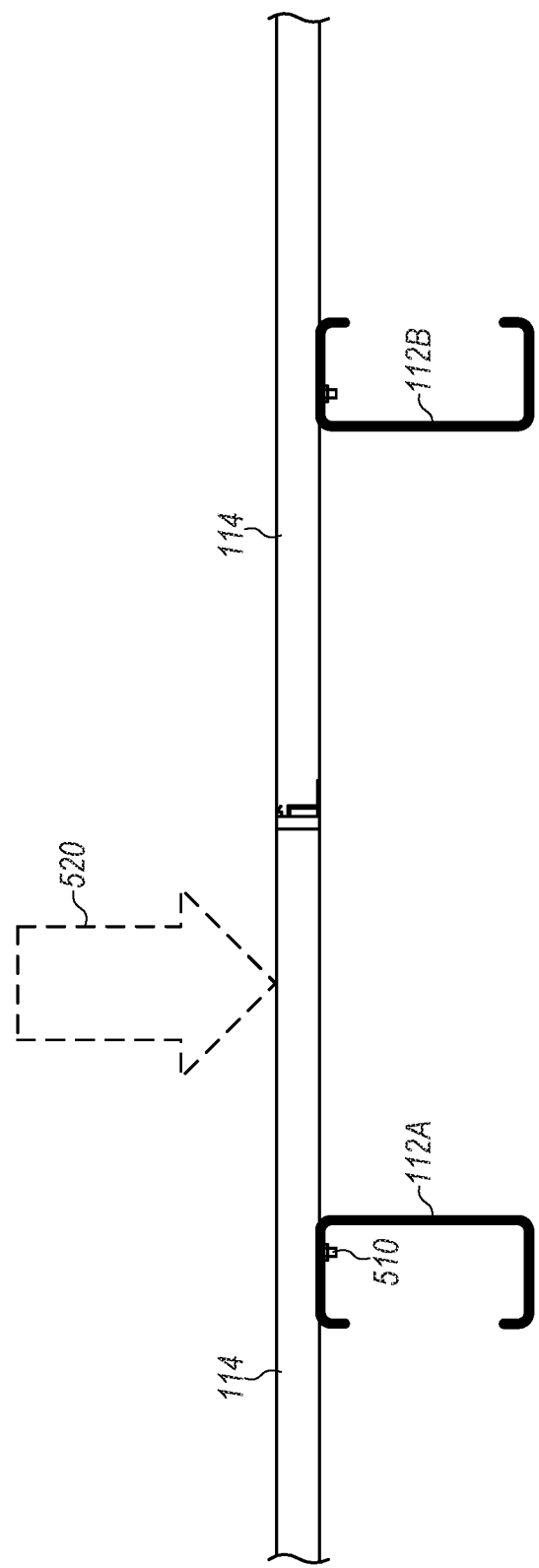

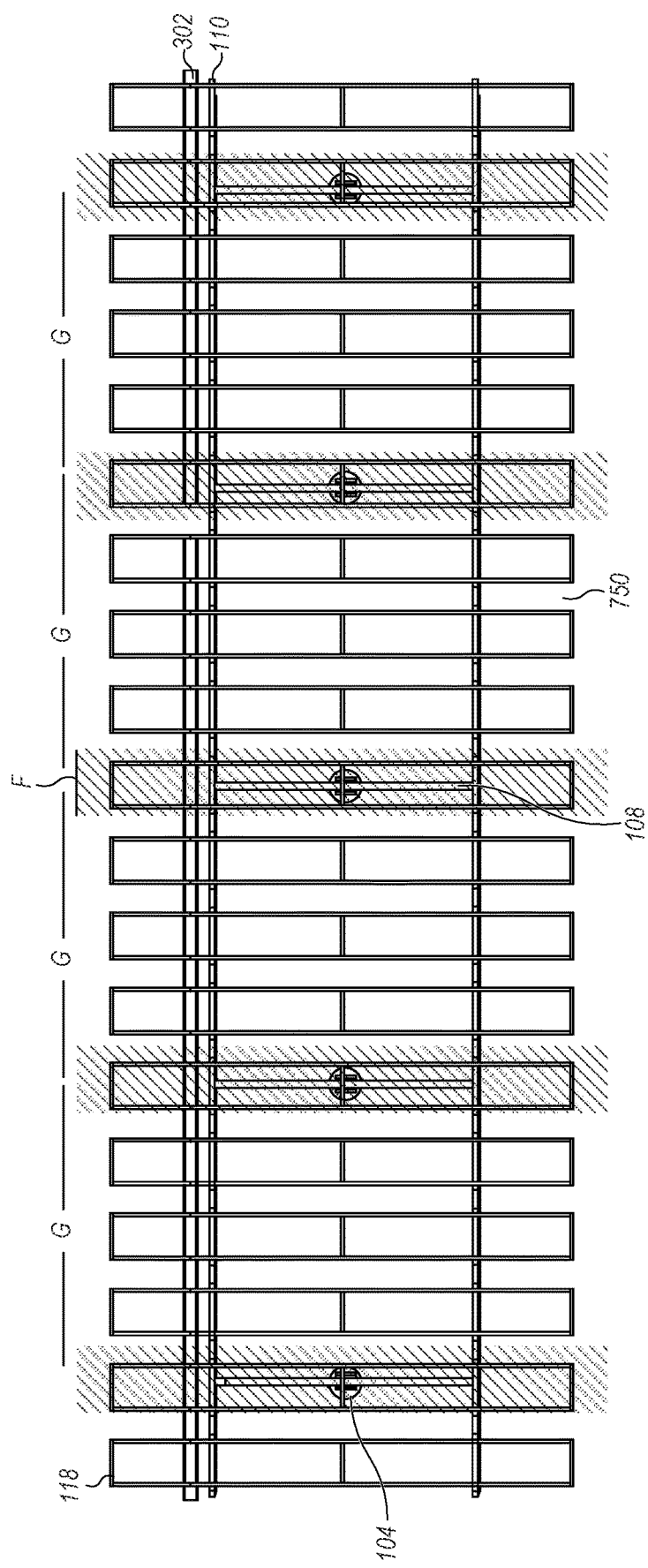

PHOTOVOLTAIC MODULE MOUNTING STRUCTURE

CROSS-REFERENCE TO RELATED APPLICATION

The present application claims the benefit of U.S. Provisional Appl. No. 63/068,017 filed on Aug. 20, 2020; which is incorporated by reference herein in its entirety.

BACKGROUND

Technical Field

This disclosure relates generally to mounting structures for photovoltaic modules.

Description of the Related Art

In order to facilitate electricity generation, solar photovoltaic (PV) modules can be mounted on various structures such as rooftops, fixed tilt ground mount structures, and active tracking structures that track the location of the sun. PV modules can also be mounted on carports in parking lots or on the tops of parking garages. Further, PV modules can be mounted on structures for pedestrian walkways, bus stops, outdoor train stations, or bike lanes. Such PV modules may be monofacial PV modules that are configured to generate electricity from received light on one side (i.e., the top) of the module or bifacial PV modules that are configured to generate electricity from received light on both sides (i.e., the top and bottom) of the module.

BRIEF DESCRIPTION OF THE DRAWINGS

FIGS. 4A and 4B are cutaway side views of embodiments of long span mounting structures in accordance with various embodiments

FIG. 5C is a cutaway side view of a PV module mounted in portrait orientation on a set of PV module support rails in accordance with various embodiments.

FIG. 6C is a cutaway side view of two PV modules mounted in landscape orientation on a set of PV module support rails in accordance with various embodiments.

FIG. 7C is a top view of the dual-tilt mounting structure of FIG. 2 with the PV modules omitted in accordance with various embodiments.

Figure 1:
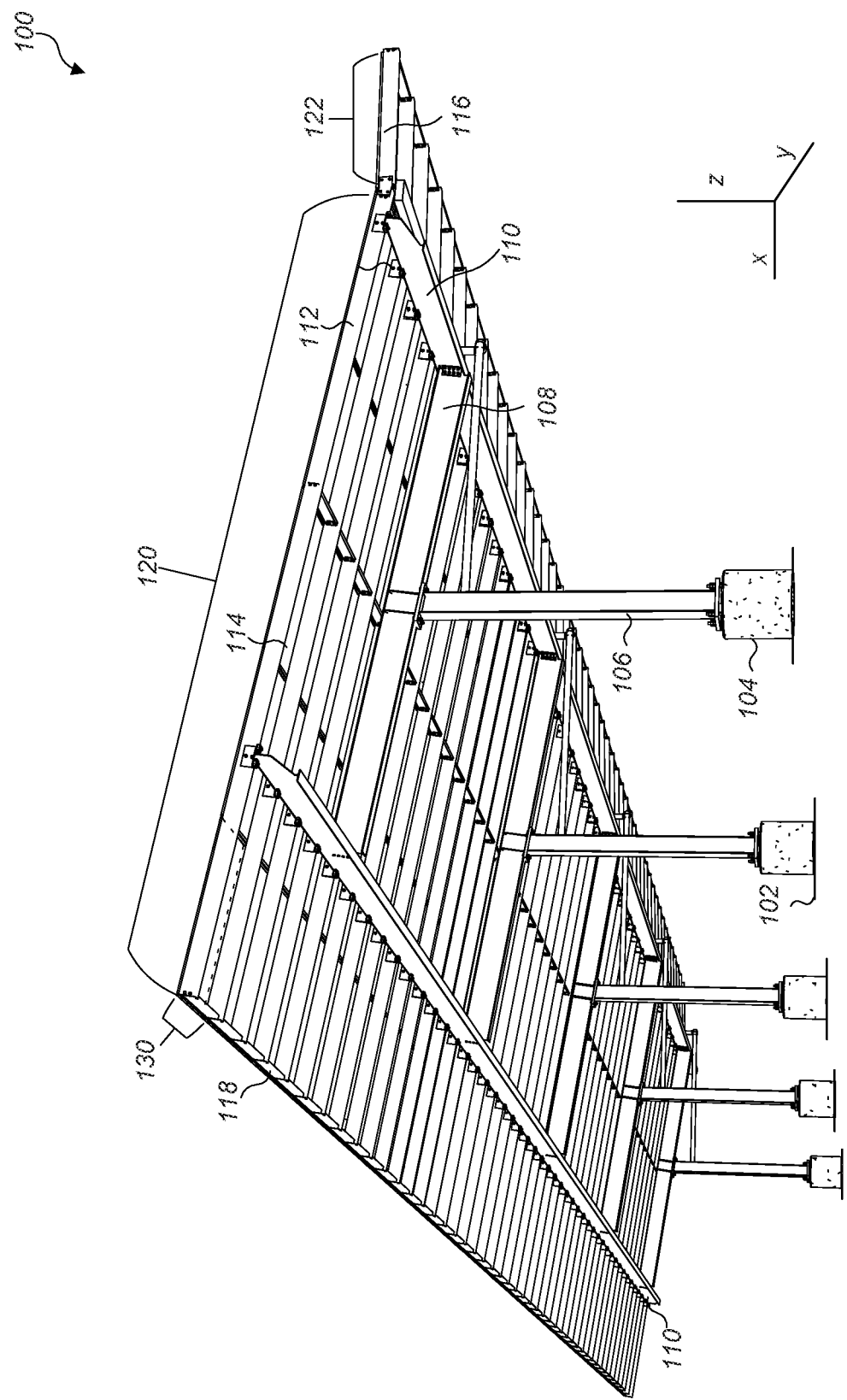
FIG. 1 is a bottom perspective view of a dual-tilt mounting structure with photovoltaic (PV) modules mounted in portrait orientation in accordance with various embodiments.

This disclosure includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a structure that when constructed implements the task (e.g., a clamp configured to couple to a crossbeam). The term "configured to" is not intended to mean "configurable to."

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the terms "first," "second," etc. are used as labels for nouns that they precede, and do not imply any type of ordering (e.g., spatial, temporal, logical, etc.) unless specifically stated. For example, references to "first" and "second" purlins would not imply an ordering between the two unless otherwise stated.

As used herein, the term "based on" is used to describe one or more factors that affect a determination. This term does not foreclose the possibility that additional factors may affect a determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is thus synonymous with the phrase "based at least in part on."

DETAILED DESCRIPTION

Mounting structures for solar photovoltaic (PV) modules allow PV modules to be installed in places such as parking lots, parking garages, bus stops, train stations, pedestrian walkways, and bike lanes. Such mounting structures are configured to secure the PV modules and to elevate them several feet in the air so other activity can occur underneath. For example, a mounting structure might secure PV modules and provide cover for cars parked or people waiting for a bus underneath. Elevated PV modules, being relatively high off the ground, are also less likely to be shaded to the extent that PV modules mounted lower to the ground might be.

In the past, mounting structures were generally used to secure monofacial PV modules that are configured to generate electricity from received light on one side (i.e., the top) of the module. Increasingly, however, there has been interest in bifacial PV modules that are able to generate more electricity (in certain conditions) because they can generate electricity from received light on both sides (i.e., the top and bottom) of the module. Depending on the configuration of the modules, monofacial PV modules and bifacial PV modules may not be mounted in the same way. In some instances, monofacial PV modules may be mounted in a landscape orientation and bifacial PV modules may be mounted in a portrait orientation for any of a number of reasons. For example, monofacial PV modules may be internally wired such that landscape mounting will generate more electricity. In contrast, bifacial PV modules may be wired to be mounted in a portrait orientation. Customers might also have an aesthetic preference for the mounting orientation. For example, if a customer has a large parking lot that already has mounting structures with PV modules installed in a landscape orientation, that customer might demand that additional mounting structure be installed with PV modules oriented the same way to match.

Many PV modules have opaque (typically metal) frames around the encapsuled solar PV cells. Such opaque frames absorb light or reflect it back into space. Because bifacial PV modules are able to generate electricity on both sides of the panel, increasing the amount of light that passes through the mounting structure to be potentially reflected back towards the backside of the bifacial PV modules means that additional electricity may be generated. Additionally, the conditions at a mounting surface might not be uniformly flat or conditions on the ground might differ from a site plan that is provided to a contractor building a mounting structure for PV modules. Further, PV modules have a finite lifespan of about 20 to 30 years under normal circumstances, and can also be damaged by falling trees or storms, and therefore might need to be replaced before the end of the useful life of the mounting structure beneath. Moreover, a customer might initially install a mounting structure with monofacial PV modules and then later upgrade to bifacial PV modules.

Mounting structures are typically made of metal such as structural steel and steel-reinforced concrete. Because PV modules mounted on a mounting structure are high voltage electrical equipment mounted on metal high in the air, there is a risk that voltage will build up on the mounting structure and result in potentially dangerous discharge. Accordingly, mounting structures employ grounding devices to establish grounding paths that flows from the frames of the PV modules, through the mounting structure, and into the ground via grounding stakes. Such grounding devices are typically installed late in the construction of the mounting structure by skilled electricians.

Accordingly, the inventors identified various issues with prior mounting structures that include, but are not limited to: (1) a mounting structure should be able to accommodate PV modules installed in landscape or portrait orientation, (2) a mounting structure should be designed such that either monofacial PV modules or bifacial PV modules may be installed on the mounting structure, (3) shading should be reduced and reflection of light should be increased to enable more light to be collected by the backside of bifacial PV modules, (4) the mounting structure should have sufficient adaptability that allows for irregularities at the construction site to be accommodated, (5) PV modules should be able to be easily replaced after installation on the mounting structure, and (6) grounding paths should be able to be established as the mounting structure is being built from the ground up by construction personnel and not after the PV modules are installed by more costly electricians. In order to address these issues, the inventors propose a novel PV module mounting structure that allows for installation of PV modules in landscape or portrait orientation and accommodates site irregularities, reduces shading and increases reflected light on the backside of PV modules, allows PV modules to be easily removed from the mounting structure, and establishes grounding paths from the ground up during construction.

Dual-Tilt Mounting Structure with PV Modules in Portrait Orientation

FIG. 1 is a bottom perspective view of a dual-tilt mounting structure 100 with photovoltaic (PV) modules 114 mounted in portrait orientation 130 in accordance with various embodiments. Mounting structure 100 is installed over a mounting surface 102. A plurality of column foundations 104 extend from the mounting surface 102 (and in embodiments, extend below into mounting surface 102). A plurality of columns 106 are coupled to the column foundations 104. A plurality of crossbeams 108 are coupled to the columns 106. A plurality of purlins 110 are coupled to the crossbeams 108. In the embodiment shown in FIG. 1, a first set of purlins 110 are coupled to a first end of crossbeams 108 on the left end of crossbeams 108. A second set of purlins 110 are coupled to a second, opposite end of crossbeams 108 on the right end of crossbeams 108. A first plurality of PV module support rails 112 are coupled to the purlins 110. A second plurality of PV module support rails 116 are coupled to the first plurality of PV module support rails 112. PV modules 114 are coupled to the PV module support rails 112, 116 in a first grid 120 and a second grid 122. PV module 114 are installed on dual-tilt mounting structure 100 in a portrait orientation 130.

In the embodiment shown in FIG. 1, dual-tilt mounting structure 100 extends along three axes. A first axis (the z-axis shown in FIGS. 1 and 2) extends upward from mounting surface 102. Column foundation 104 and columns 106 lay at least in part along the first axis. A second axis (the x-axis shown in FIGS. 1 and 2) extends orthogonally from the second axis. Crossbeams 108 and PV module rails 112 lay at least in part along the second axis. A third axis (the y-axis shown in FIGS. 1 and 2) extends orthogonally from the second and third axes. Purlins 110 lay at least in part along the third axis.

Mounting surface 102 may be any of a number of surfaces onto which a mounting structure (e.g., mounting structure 100) is installed. In some embodiments, mounting surface 102 is a parking lot on the ground or a top level of a parking garage. In such embodiments, dual-tilt mounting structure 100 is configured to allow cars and trucks to be installed underneath dual-tilt mounting structure 100. In such embodiments, dual-tilt mounting structure 100 may be referred to herein as a "carport." In other embodiments, however, dual-tilt mounting structure 100 (or any mounting structure discussed herein such as mounting structures 200, 320, 330, 340, 400, and 410) are not limited to embodiments in which the mounting structure is a carport installed over a parking lot. In various embodiments, mounting surface 102 is a street or a sidewalk and the mounting surface is useable as cover for a pedestrian walkway, bus stop, or bike lane. Alternatively, mounting surface 102 may be a train platform and the mounting surface is usable as a cover for a train platform.

Column foundations 104 are steel-reenforced concrete pillars that extend into mounting surface 102 in various embodiments. In some embodiments, however, column foundation 104 may be made of other materials and/or may be secured to mounting surface 102 by fasteners such as bolts (not shown). Columns 106 are coupled to a top surface of column foundations 104 by a plurality of fasteners (e.g., fasteners 310 shown in FIGS. 3A-3D). In various embodiments, no column foundation 104 is present and column 106 is directly fastened to mounting surface 102 (e.g., embodiments in which mounting structure is smaller than the embodiments shown in FIG. 1 and is not used as a carport). In various embodiments, column 106 is an I-beam, a square beam (shown in FIG. 1), or a tube or other suitable shape. In various embodiments, column 106 is made of metal (such as stainless steel) or an electrically conductive composite material. In various embodiments, column 106 includes a first flat plate on the bottom with openings configured to accept fasteners to couple the column 106 to a column foundation 104 (or mounting surface 102) and a second flat plate on the top with openings configured to accept fasteners to couple the column 106 to crossbeam 108. In other embodiments, the top of column 106 is saddle-shaped and partially surrounds crossbeam 108. The coupling of column 106 to crossbeam 108 is discussed in additional detail in reference to FIG. 7A.

Crossbeams 108 are coupled to the top ends of columns 106. In various embodiments, crossbeams 108 are I-beams, although other suitable shapes may be used (e.g., a square beam). A first set of purlins 110 is coupled to first end of crossbeams 108 and a second set of purlins 110 is coupled to second end of crossbeams 108. In various embodiments, crossbeam 108 is made of metal (such as stainless steel) or an electrically conductive composite material. The coupling of crossbeam 108 to purlins 110 is discussed in additional detail in reference to FIG. 7A.

Figure 2:
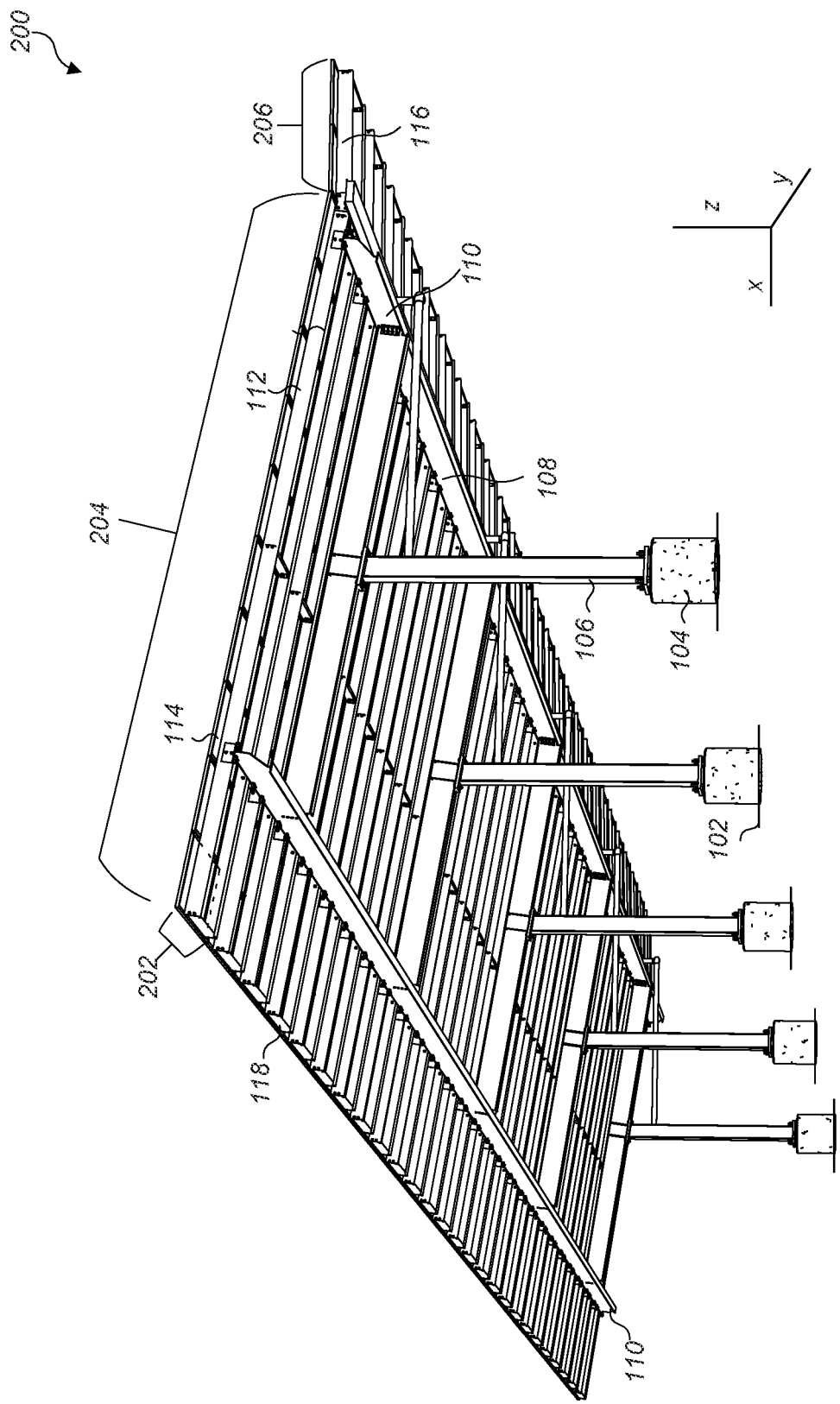
FIG. 2 is a bottom perspective view of a dual-tilt mounting structure with PV modules mounted in landscape orientation in accordance with various embodiments.
Figure 5A:
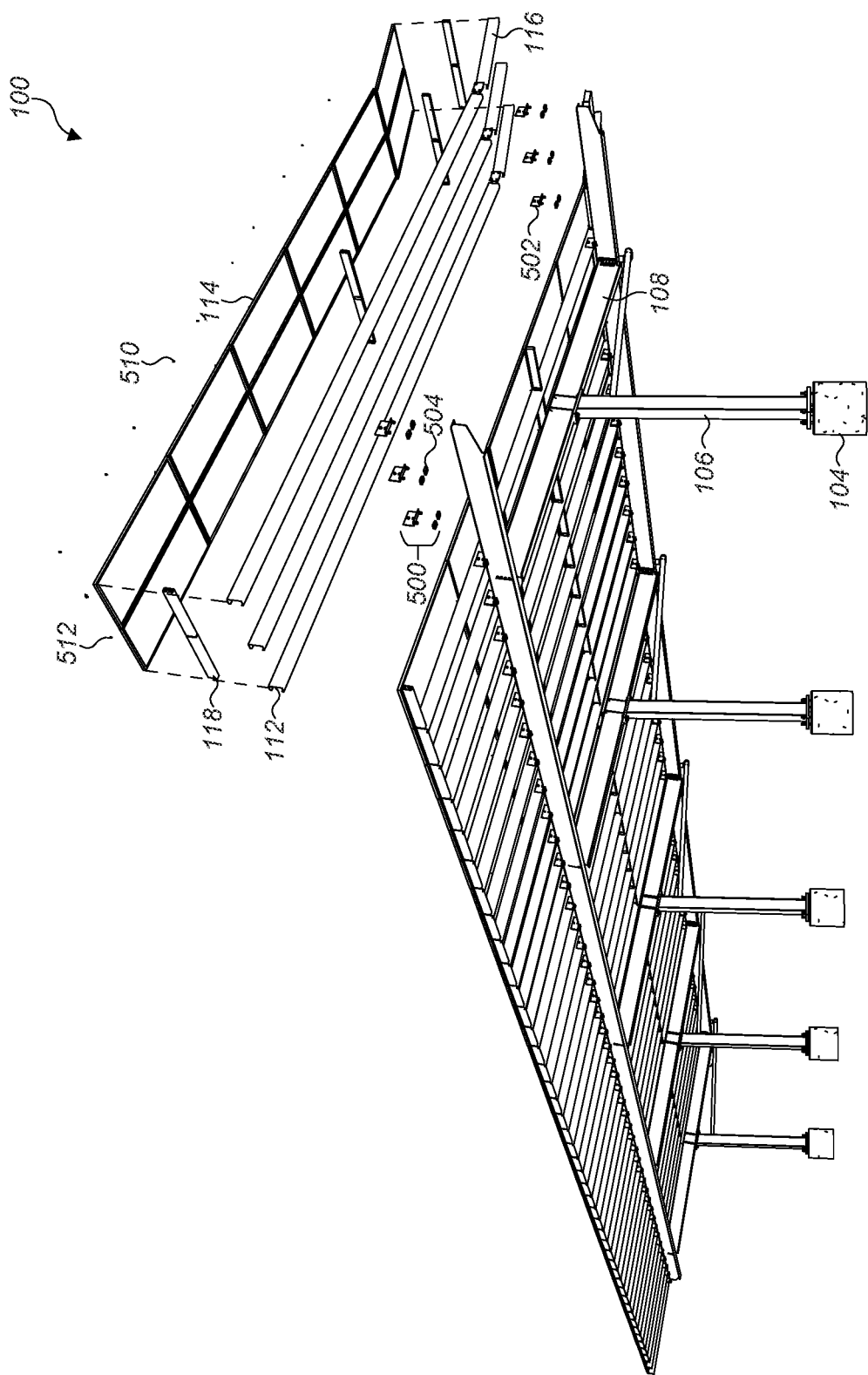
FIG. 5A is a bottom perspective partially exploded view of the dual-tilt mounting structure with PV modules mounted in portrait orientation of FIG. 1 in accordance with various embodiments.
Figure 6A:
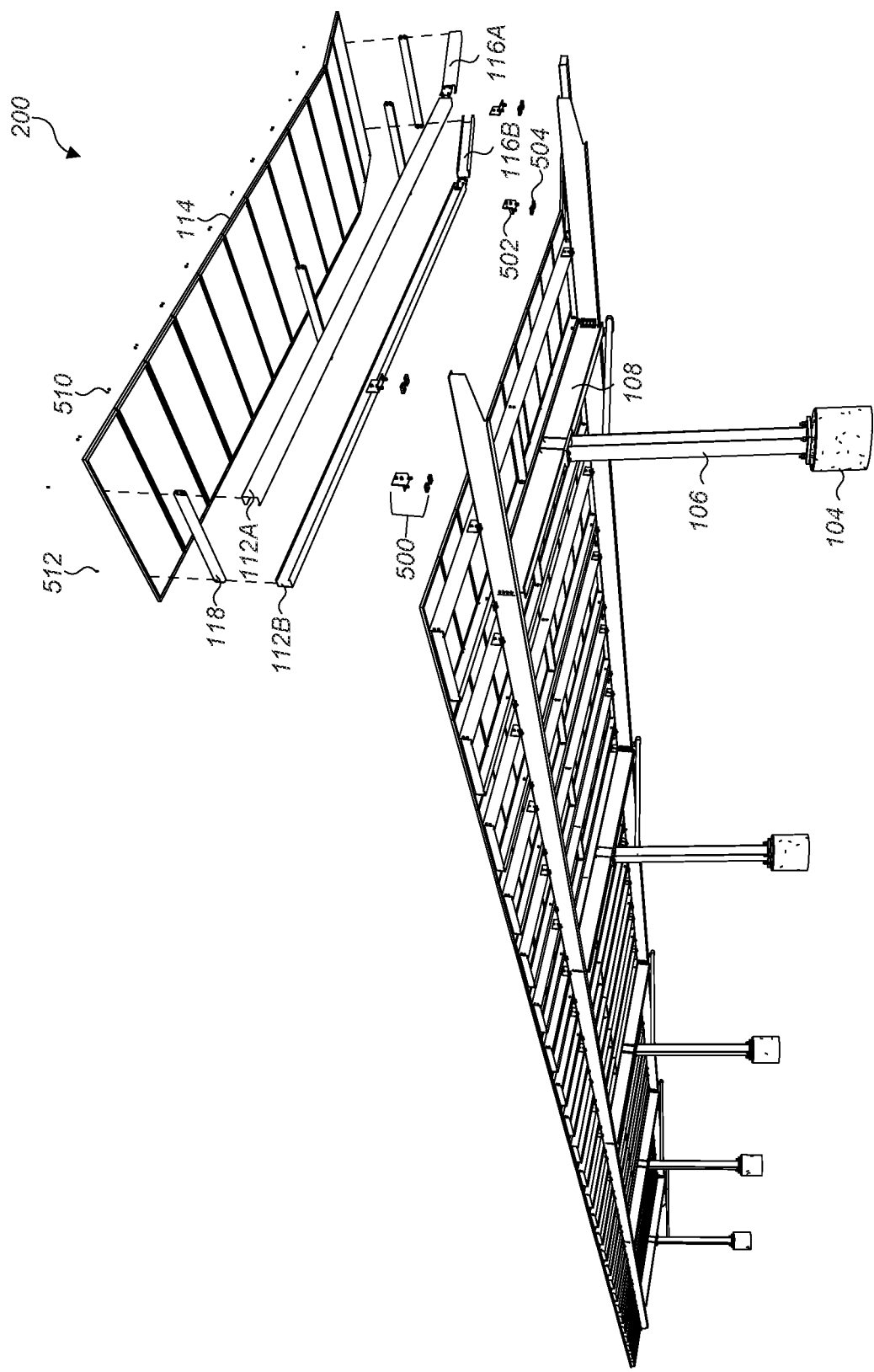
FIG. 6A is a bottom perspective partially exploded view of the dual-tilt mounting structure with PV modules mounted in landscape orientation of FIG. 2 in accordance with various embodiments.
Figure 6B:
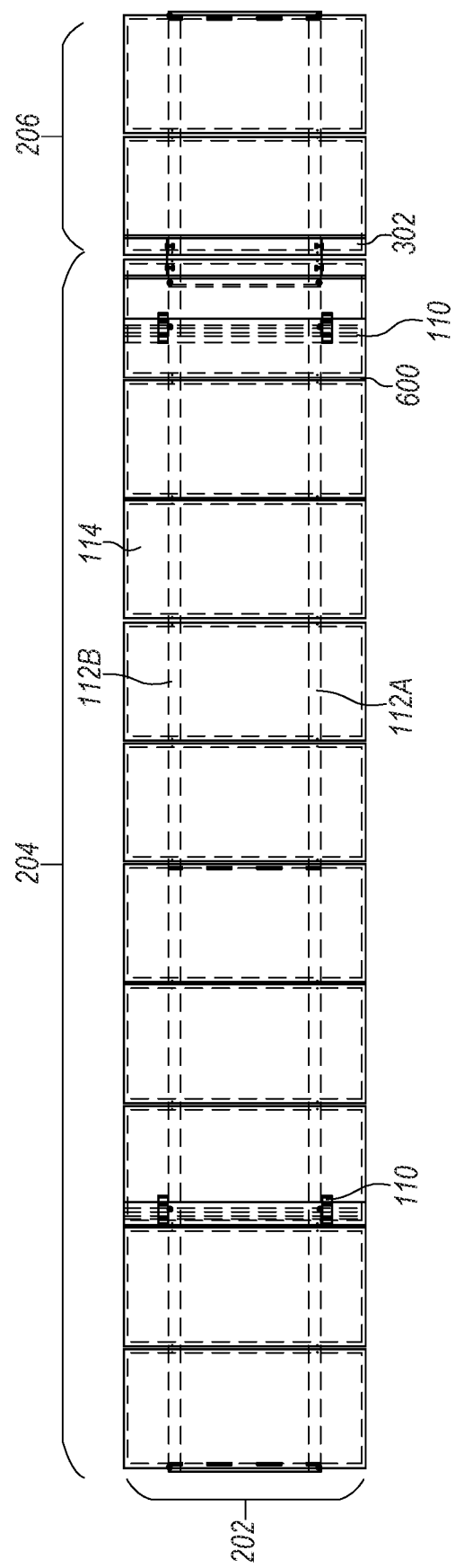
FIG. 6B is a top view of a set of PV modules mounted in landscape orientation on a set of PV module support rails in accordance with various embodiments.
Figure 7A:
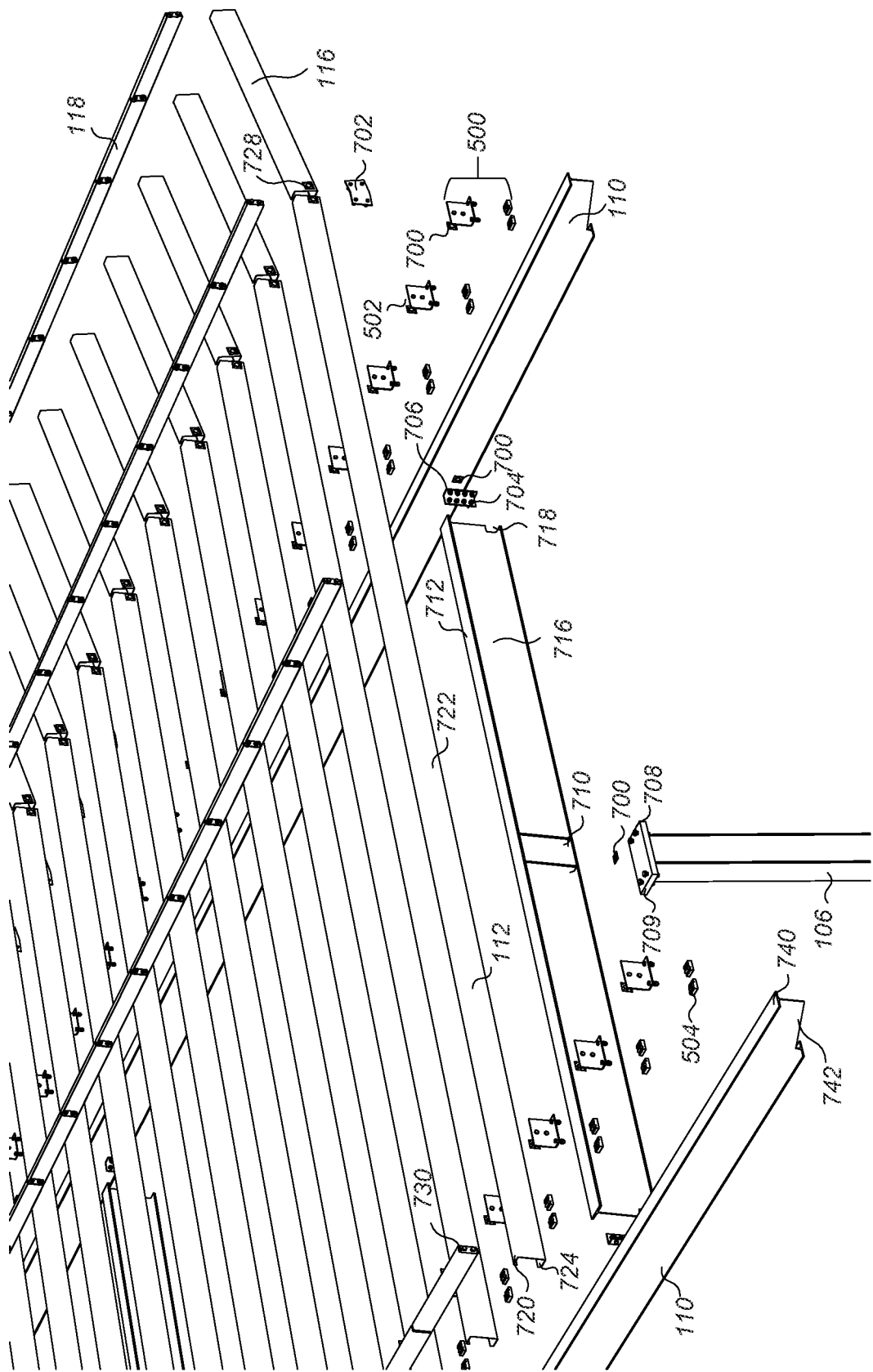
FIG. 7A is an exploded top view of a portion of the dual-tilt mounting structure of FIG. 1 with the PV modules omitted in accordance with various embodiments.

In various embodiments, purlins 110 are coupled to crossbeams 108 at the lateral sides of crossbeams 108 as shown in FIG. 1 (e.g., fasteners 706 and brackets 704 as discussed in additional detail in reference to FIG. 7A). In various other embodiments, however, purlins 110 could instead rest on top of crossbeams 108 and be coupled to the top of crossbeams 108 by fasteners that extend downward (i.e., along the first axis) through purlins 110 and into crossbeams 108. In various embodiments, purlins 110 are I-beams (as shown in FIGS. 1 and 2) but in other embodiments, purlins 110 may be T-beams or square beams. In various embodiments, purlins 110 define a top flange upon which PV module support rails 112 lie and a bottom surface that faces mounting surface 102. In various embodiments, bottom surface defines a flange (e.g., if purlin 110 is an I-beam). PV module support rails 112 are coupled to purlins 110 (e.g., by clamps 500 shown in FIGS. 5A and 6A). The coupling of purlins 110 to PV module support rails 112 is discussed in additional detail in reference to FIGS. 5A, 6B, and 7A.

In the dual-tilt embodiment shown in FIG. 1 (and in FIG. 2) a first set of PV module support rails 112 are coupled to purlins 110 and a second set of PV module support rails 116 are coupled to the first set of PV module support rails 112. In the embodiment shown in FIG. 1, the PV module support rails 112 and 116 are C-shaped beams that define a top surface, an opposing bottom surface, and a middle surface disposed between the top surface and the bottom surface. In various embodiments, PV module support rails 112, 116 are made of metal (such as stainless steel) or an electrically conductive composite material. As discussed in further detail in reference to FIGS. 5A and 6A, the bottom surface of PV module support rails 112 rests on purlins 110. In various embodiments, a clamp (e.g., clamp 500 shown in FIGS. 5A and 6A) is used to couple the middle surface of PV module support rails 112 to the purlins 110. In various embodiments, PV module support rails 116 have a similar (or identical) cross-section to PV module support rails 112, but instead of resting on purlins 110, PV module support rails 116 are coupled to PV module support rails 112 (e.g., by bracket 702 shown in FIG. 7A) and are cantilevered over mounting surface 102. PV modules 114 are coupled to PV module support rails 112 and PV module support rails 116 (e.g., by fasteners 510 shown in FIGS. 5A and 5B). In various embodiments, blocking rails 118 are coupled to the ends of PV module support rails 112, 116 to provide lateral support for PV module support rails 112, 116.

The arrangement of PV module support rails 112 (and in dual-tilt embodiments the PV module support rails 116) relative to the purlins 110 varies depending on the size of the PV modules 114 and the orientation (i.e., landscape orientation 202 shown in FIG. 2 versus portrait orientation 130). As discussed in further detail in reference to FIGS. 5A and 6A, the spacing of PV module support rails 112, 116 relative to each other may differ according to the size and orientation of PV modules 114. In various embodiments in which PV modules 114 are installed in portrait orientation 130, PV module support rails 112, 116 face the same direction. In various embodiments in which PV modules 114 are installed in landscape orientation, however, pairs of PV module support rails 112, 116 may face each other (e.g., PV module support rails 112A and 112B shown in FIG. 6A). In various embodiments, blocking rails 118 are disposed between every PV module support rail 112, 116, but in other embodiments blocking rails are only disposed between opposing sets of PV module support rails 112, 116 (e.g., as shown in FIG. 6A).

In the embodiment shown in FIG. 1, PV modules 114 are disposed in portrait orientation 130 in a first grid 120 having columns extending along the second axis and rows extending along the third axis. As shown in additional detail in FIGS. 5A and 5B, adjacent columns of PV modules 114 in first grid 120 share a PV module support rail 112 between them. Thus, if a first set of PV modules 114 are in a first column and second set of PV modules 114 are in an adjacent second column, they are secured to a top surface of a same PV module support rail 112 disposed between the first column and the second column. Similarly, PV modules 114 in dual-tilt embodiments like dual-tilt mounting structure 100 are disposed in portrait orientation 130 in a second grid 122 having columns extending along the second axis and rows extending along the third axis. In various embodiments, adjacent columns of PV modules 114 in second grid 122 share a PV module support rail 116 between them in the same fashion as first grid 120. In various embodiments, the columns of first grid 120 and second grid 122 are aligned and the rows of the first grid and the second grid are parallel. As shown in FIG. 1, first grid 120 and second grid 122 are disposed on planes that intersect. In various embodiments, first grid 120 lies at between a 2- and 15-degree angle relative to mounting surface 102 and second grid 122 lies at between a −2- and −5-degree angle relative to mounting surface 102.

PV modules 114 may be any of a number of rectangular-shaped PV modules. In various embodiments, PV modules 114 are surrounded by frames made of metal (e.g., steel, aluminum, etc.), composite, or plastic. In such embodiments, PV modules 114 are secured to PV module support rails 112 by fasteners that pass through the frames of PV modules 114 and PV module support rails 112 (e.g., as shown in FIGS. 5A and 6A) or by clamps that couple to the top side of PV modules 114 and are secured to PV module support rails 112. In various embodiments, such frames are opaque. In some embodiments, however, PV modules 114 are frameless (e.g., frameless bifacial PV modules) and are mounted to PV module support rails 112 by adhesives or clamps that couple to the top side of PV modules 114 and are secured to PV module support rails 112. As discussed herein, PV modules 114 may be mounted in portrait orientation 130 (i.e., the long side of the PV module 114 is parallel to PV module support rails 112 and crossbeams 108) or in landscape orientation 202 (i.e., the long side of the PV module 114 is perpendicular to PV module support rails 112 as shown in FIG. 2.

In various embodiments, PV modules 114 are monofacial modules with photovoltaic cells (e.g., monocrystalline silicon photovoltaic cells, polycrystalline silicon photovoltaic cells) arranged on an opaque backing sheet and surrounded by an encapsulant. The photovoltaic cells in a monofacial PV module 114 may be front-contact photovoltaic cells arranged individually or in a shingled arrangement in which adjacent photovoltaic cells overlap. Alternatively, photovoltaic cells in a monofacial PV module 114 may be interdigitated back contact photovoltaic cells. In other embodiments, PV modules 114 are monofacial thin-film photovoltaic modules. In other embodiments, PV modules 114 are bifacial modules with photovoltaic cells (e.g., monocrystalline silicon photovoltaic cells, polycrystalline silicon photovoltaic cells) arranged on a transparent backing sheet and surrounded by an encapsulant. In such embodiments, the photovoltaic cells of a bifacial PV module 114 are configured to generate electricity that is received from the sun directly on the top surface of the PV module 114 that faces the sun and indirectly (i.e., reflected light, ambient light) on the bottom surface of the PV module that faces mounting surface 102. It will be understood that light that is received by a solar cell of a PV module 114 causes electricity to be generated, light that passes through a clear encapsulant continues on towards mounting surface 102, and light that impacts an opaque frame or encapsulant is absorbed or reflected.

Thus, in embodiments such as FIG. 1, PV modules 114 are disposed in portrait orientation 130 with the long edges of the frames of PV modules 114 lying on top of PV module support rails 112 and 116. In embodiments in which PV modules 114 are bifacial, this means that fewer shadows are cast on the back side of the bifacial PV modules 114 by structural steel such as PV module support rails 112 and 116, which would prevent a certain amount of reflected or ambient light from reaching the back side of the bifacial PV modules 114. For example, if a bifacial PV module 114 was arranged in landscape orientation 202 (e.g., as shown in FIG. 2 and FIG. 6B for example) any light reflected from the mounting surface 102 onto the bottom surface of the PV module support rails 112 and 116 that intersect with the long edges of the frames of PV modules 114 would not reach the backside of the solar cells of the PV modules 114.

Dual-Tilt Mounting Structure with PV Modules in Landscape Orientation

FIG. 2 is a bottom perspective view of a dual-tilt mounting structure 200 with PV modules 114 mounted in landscape orientation 202 in accordance with various embodiments. In various embodiments, the mounting surface 102, column foundations 104, columns 106, crossbeams 108, and purlins 110 are identical to those described above in reference to FIG. 1. Indeed, in various embodiments, a dual-tilt mounting structure 200 may be reconfigured to become a dual-tilt mounting structure 100 shown in FIG. 1 by reconfiguring the arrangement of PV module support rails 112 and 116, blocking rails 118, and PV modules 114. In various embodiments, the PV modules 114 installed on dual-tilt mounting structure 200 are installed in landscape orientation 202. In various embodiments, such PV modules 114 are monofacial PV modules. Accordingly, in various instances the monofacial PV modules 114 may be removed from dual-tilt mounting structure 200, the PV module support rails 112 and 116 and blocking rails 118 repositioned, and bifacial PV modules 114 installed in portrait orientation 130. Accordingly, the same column foundations 104, columns 106, crossbeams 108, purlins 110, PV module support rails 112 and 116, blocking rails 118, and PV modules 114 are usable to construct a dual-tilt mounting structure 200 with PV modules 114 mounted in landscape orientation 202 or a dual-tilt mounting structure 100 with PV modules 114 mounted in portrait orientation 130.

As discussed in additional detail in reference to FIGS. 6A and 6B, in various embodiments, the same PV module support rails 112 and 116 and blocking rails 118 may be used to construct dual-tilt mounting structure 200. In various embodiments, however, rather than all of the PV module support rails 112 and 116 facing the same direction, pairs of PV module support rails 112 and 116 may face each other. Additionally, blocking rails 118 may be installed between pair of facing PV module support rails 112 and 116 and not between PV module support rails 112 and 116 that face away from each other. This configuration can be seen more clearly in FIG. 6A below.

In contrast to portrait orientation 130 in which the long sides of the frames of the PV modules 114 lay on top of PV module support rails 112 and 116, in landscape orientation 202, the long sides of the frames of PV modules 114 are perpendicular to PV module support rails 112 and 116. As with first grid 120 and second grid 122 of FIG. 1, the landscape-oriented PV module 114 in FIG. 2 are arranged in a first grid 204 and a second grid 206 in which columns for first grid 204 are aligned with columns of second grid 206 and first grid 204 and second grid 206 define planes that intersect.

As shown in FIG. 6B, landscape orientation 202 results in shadows being cast on the backside of the PV modules 114, but if the PV modules 114 are monofacial, this will not affect power generation. Moreover, depending on the shading conditions at a particular site (e.g., due to trees or tall buildings) a landscape orientation 202 may result in more power generation than portrait orientation 130, even for bifacial PV modules 114. Accordingly, the mounting structures described herein allow for flexibility in both design and construction of the mounting structure without having to use different sets of parts.

Side Views of Various Single-Tilt and Dual-Tilt Mounting Structures

FIGS. 3A-3D are cutaway side views of various embodiments of mounting structures in accordance with various embodiments. FIGS. 4A and 4B are cutaway side views of embodiments of long span mounting structures in accordance with various embodiments. In various embodiments, each of the mounting structure depicted in FIGS. 3A-3D and 4A-4B are constructed over a mounting surface 102 and include arrangements of column foundation 104 and columns 106 as described above.

Figure 3A:
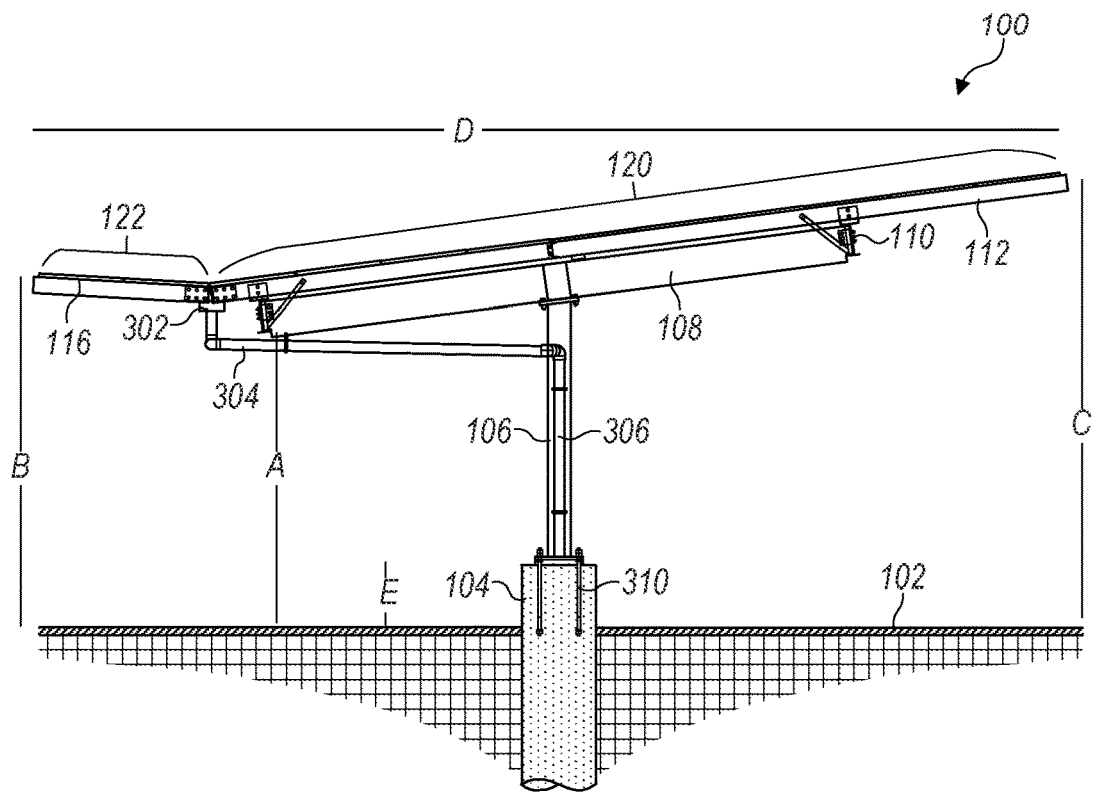
FIGS. 3A-3D are cutaway side views of various embodiments of mounting structures in accordance with various embodiments.

Referring individually to FIG. 3A, a side view of a dual-tilt mounting structure 100 is shown (although in various embodiments a side view of dual-tilt mounting structure 200 would also look like FIG. 3A). In addition to mounting surface 102, column foundation 104, columns 106, crossbeams 108, purlins 110, and PV module support rails 112 and 116 discussed above in reference to FIGS. 1 and 2, FIG. 3A identifies various water management features. A gutter 302 is disposed beneath the junction of PV module support rails 112 and 116 and collects water that flows across first grid 120 and second grid 122. Gutter 302 drains through pipe 304 and into a downspout 306 in column 106. In various embodiments, downspout 306 discharges water onto mounting surface 102 or into a cistern installed on mounting surface 102 (not shown), but in other embodiments, downspout 306 drains to pipes beneath mounting surface 102 (e.g., to a drainage system of a parking garage, to a rainwater sewer, to an underground cistern). As shown in FIG. 3A, column foundation 104 is partially cut away, showing fasteners 310 that are buried in column foundation 104 and are received by corresponding openings on a flat bottom portion of column 106. Nuts are used to secure column 106 to fasteners 310 in various embodiments.

FIG. 3A also includes various dimensions A-E. As shown in FIG. 3A, the longest dimension is D, the span of the top of mounting structure 100. In various embodiments, D is 41 feet, 10 inches (approximately 12.75 meters). Dimension E, the extent to which column foundations 104 extend above mounting surface 102 is between 2.5 feet (approximately 0.76 meters) and 4 feet (approximately 1.22 meters). Dimensions B and C are based on Dimension A, which is the minimum clearance under mounting structure 100. In some embodiments, Dimension A is 11 feet (approximately 3.35 meter) and Dimension B is 14 feet, 4 inches (approximately 4.37 meters) and Dimension C is 18 feet, 5 inches (approximately 5.61 meters). In other embodiments, Dimension A is 13 feet, 6 inches (approximately 4.11 meters) and Dimension B is 16 feet, 10 inches (approximately 5.13 meters) and Dimension C is 20 feet, 11 inches (approximately 6.38 meters). It will be understood, however, that these Dimensions A-E may vary from these numbers (e.g., by 5%, 10%, etc.) and may be changed based on customer requirements (e.g., Dimension A defines a higher minimum clearance for larger vehicles). Further, the mounting structure 100 shown in FIG. 3A is a carport, and the Dimensions A-E may be reduced for applications requiring shorter spans and/or smaller minimum clearances.

Figure 3B:
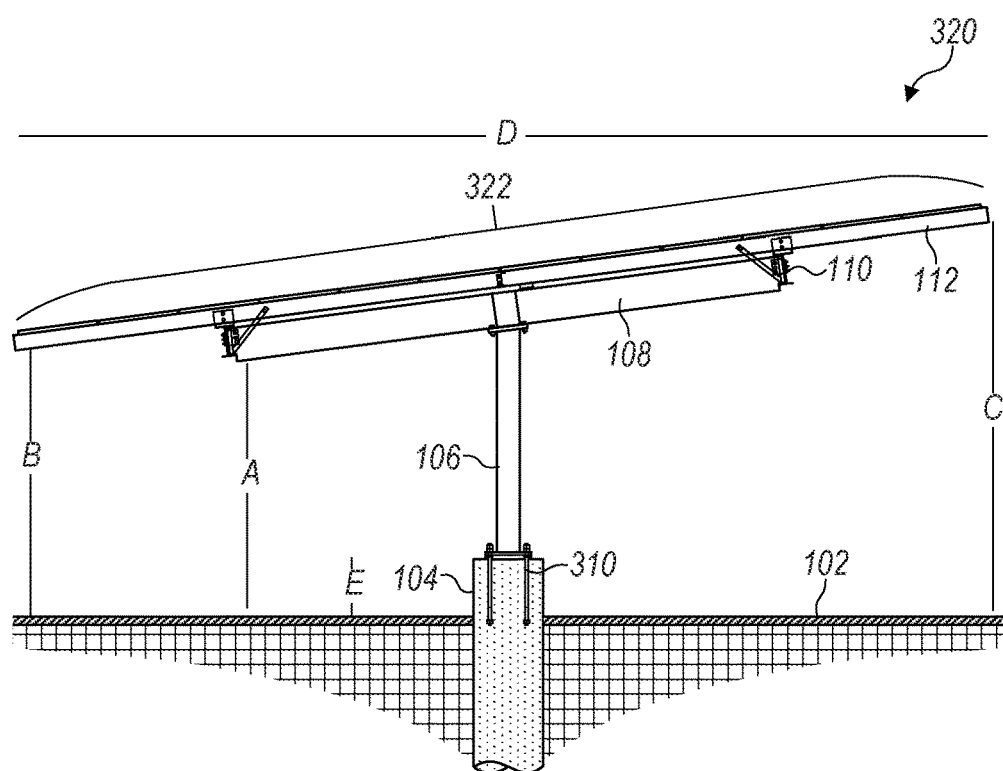

Referring now to FIG. 3B, a single-tilt mounting structure 320 is shown. In the single-tilt mounting structure 320, no PV module support rails 116 are present, and PV module support rails 112 are longer. Additionally, the water management features of FIG. 3A are not present. In FIG. 3B, PV modules 114 are arranged in a single grid 322. FIG. 3B also includes various dimensions A-E. As shown in FIG. 3B, the longest dimension is D, the span of the top of mounting structure 320. In various embodiments, D is 41 feet, 9 inches (approximately 12.72 meters). Dimension E, the extent to which column foundations 104 extend above mounting surface 102 is between 2.5 feet (approximately 0.76 meters) and 4 feet (approximately 1.22 meters). Dimensions B and C are based on Dimension A, which is the minimum clearance under mounting structure 100. In some embodiments, Dimension A is 11 feet (approximately 3.35 meter) and Dimension B is 12 feet, 4 inches (approximately 3.76 meters) and Dimension C is 17 feet, 8 inches (approximately 5.38 meters). In other embodiments, Dimension A is 13 feet, 6 inches (approximately 4.11 meters) and Dimension B is 14 feet, 10 inches (approximately 4.52 meters) and Dimension C is 20 feet, 2 inches (approximately 6.15 meters). It will be understood, however, that these Dimensions A-E may vary from these numbers (e.g., by 5%, 10%, etc.) and may be changed based on customer requirements (e.g., Dimension A defines a higher minimum clearance for larger vehicles). Further, the mounting structure 320 shown in FIG. 3B is a carport, and the Dimensions A-E may be reduced for applications requiring shorter spans and/or smaller minimum clearances.

Figure 3C:
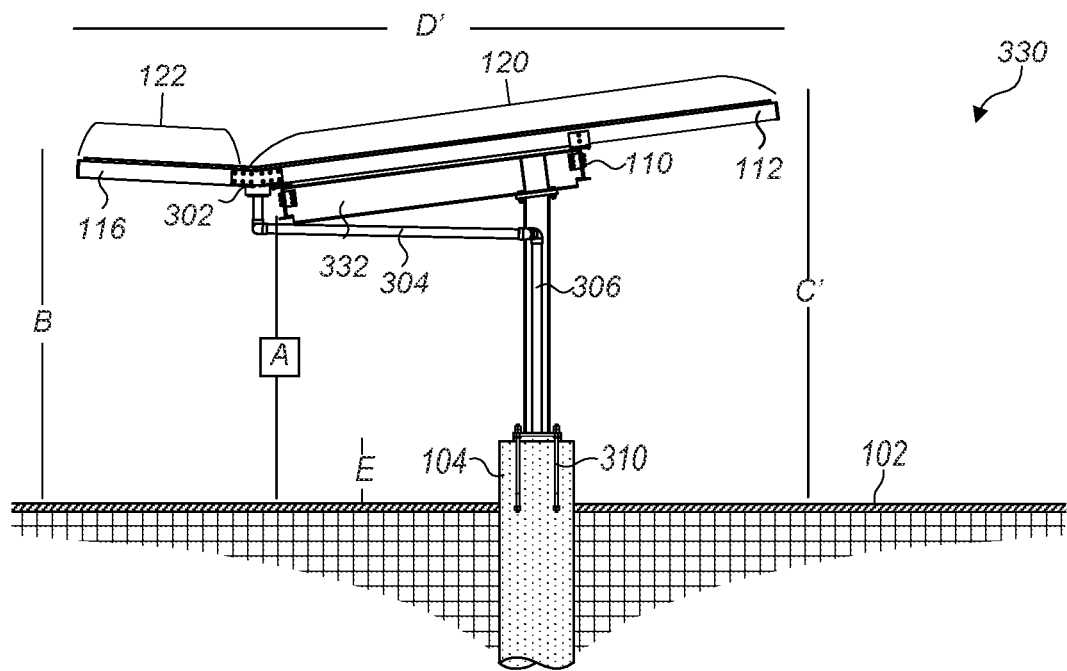
Figure 3D:
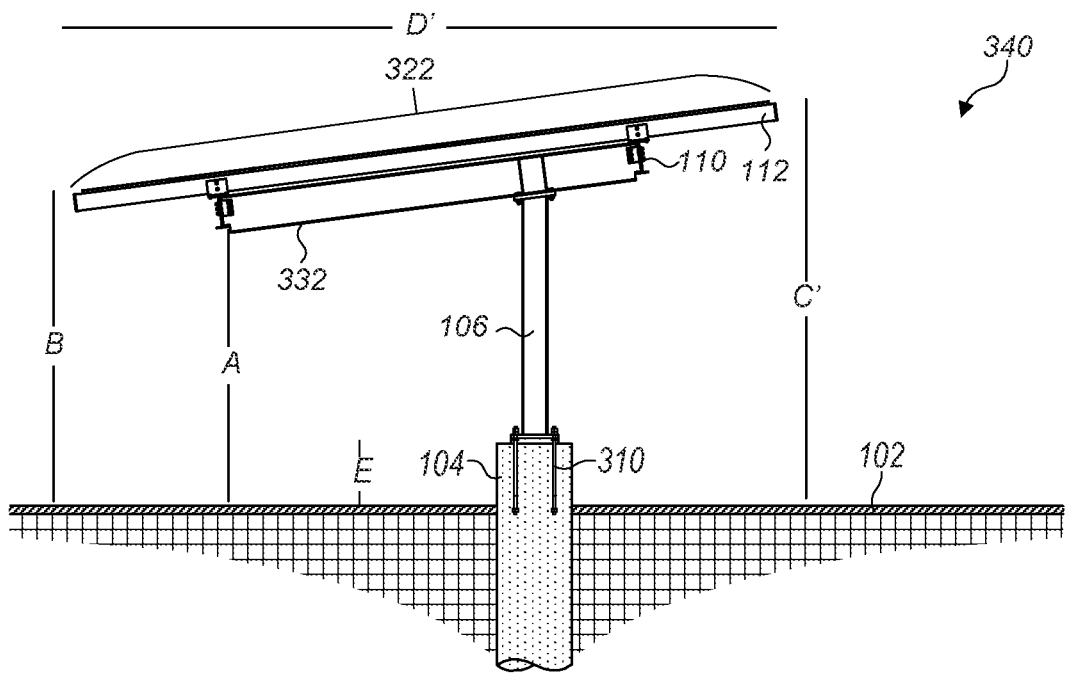

Referring now to FIG. 3C, a shorter span dual-tilt mounting structure 330 is shown. In shorter span dual-tilt mounting structure 330, Dimension D' is shorter than Dimension D in FIG. 3A and Dimension C' is shorter than Dimension C in FIG. 3A. Similarly, the crossbeam 332 is shorter than crossbeam 108. Referring now to FIG. 3D, a shorter span single-tilt mounting structure 340 is shown. In shorter span single-tilt mounting structure 340, Dimension D' is shorter than Dimension D in FIG. 3B and Dimension C' is shorter than Dimension C in FIG. 3B. Similarly, the crossbeam 332 is shorter than crossbeam 108. In both shorter span dual-tilt mounting structure 330 and shorter span single-tilt mounting structure 340 PV module support rails 112 are shorter as well.

Referring now to FIGS. 4A and 4B, a long span dual-tilt mounting structure 400 and a long span single-tilt mounting structure 410 are shown, respectively. In mounting structures 400 and 410, crossbeams 402 may be longer than crossbeams 108 and are connected to two sets of column foundations 104 and columns 106 and PV module support rails 112 may be longer. In some embodiments, crossbeams 402 and PV module support rails 112 in long span mounting structures may be comprised of multiple crossbeams 402 or PV module support rails 112 that are coupled together end-to-end.

PV Modules Mounted in Portrait Orientation

Figure 5B:
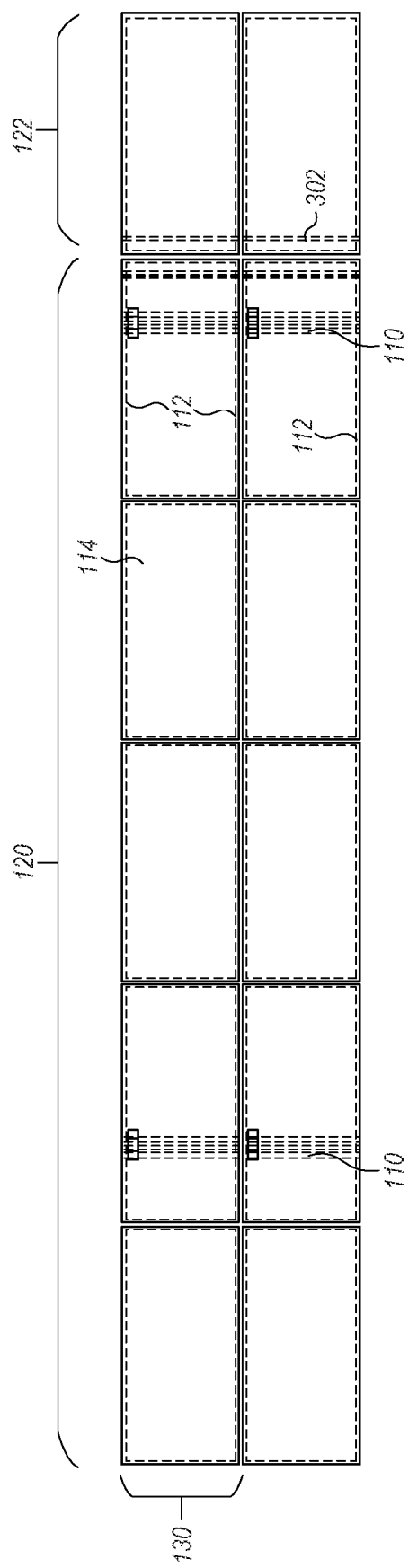
FIG. 5B is a top view of a set of PV modules mounted in portrait orientation on a set of PV module support rails in accordance with various embodiments.
Figure 5D:
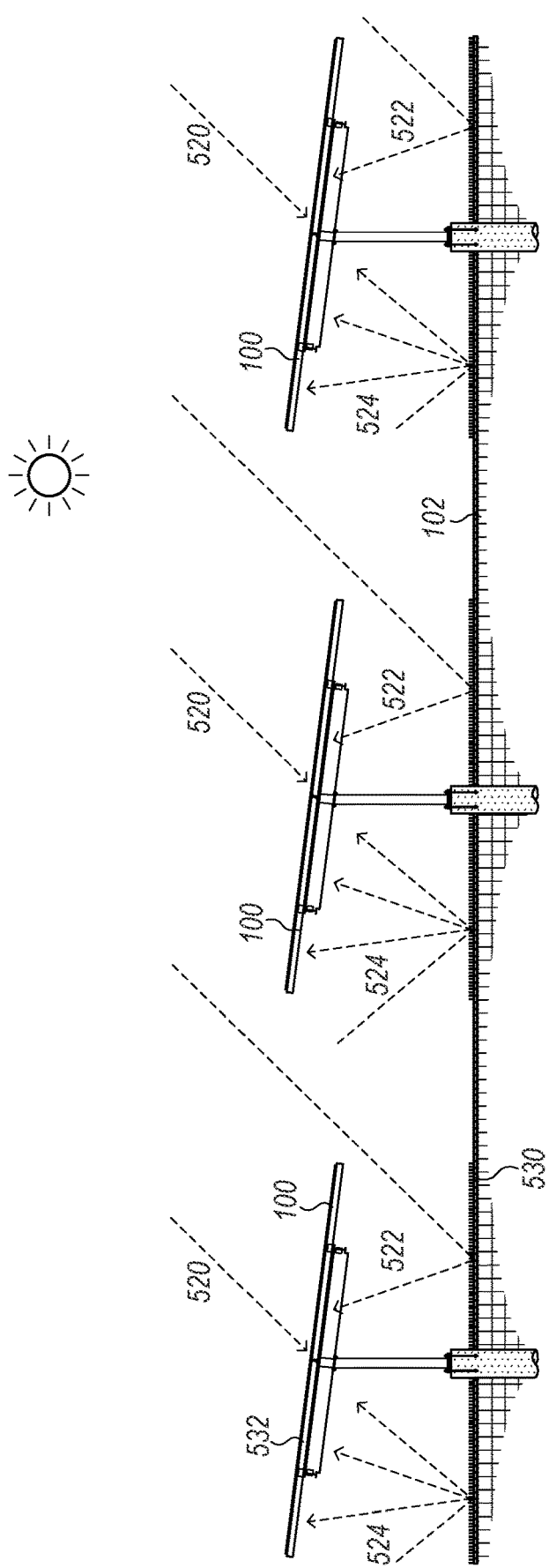
FIG. 5D is a sideview of a plurality of mounting structures and a mounting surface with reflective coatings in accordance with various embodiments.

FIGS. 5A-5C relate to embodiments in which PV modules 224 are mounted in portrait orientation 130. FIG. 5D relates to reflected light and relates to bifacial PV modules, which are mounted in portrait orientation 130 in some embodiments, but may be mounted in landscape orientation 202 as well. Referring now to FIG. 5A, a bottom perspective partially exploded view of the dual-tilt mounting structure 100 with PV modules 114 mounted in portrait orientation 130 is shown. As discussed herein, though, the mounting of PV modules 114 in portrait orientation 130 is not limited to mounting structure 100 and can be used on the single-tilt, shorter span, and/or longer span embodiments discussed above.

In FIG. 5A, a set of PV module support rails 112 and 116, PV modules 114, and blocking rails 118 are exploded of off purlins 110. Clamps 500 and fasteners 510 and 512 are also shown. As shown in FIG. 5A, clamps 500 are used to secure PV module support rails 112 to purlins 110, fasteners 510 are used to secure PV modules 114 to PV module support rails 112 and 116, and fasteners are used to secure blocking rails 118 to PV modules 114.

As shown in FIG. 5A and discussed previously, PV module support rails 112 and 116 are C beams in various embodiments. As shown in FIG. 5A, a lateral side of the C beam faces the viewer and the open side of the C beam faces away from the viewer. PV module support rails 112 and 116 include a bottom surface that is coupled to purlins 110. The top surface of PV module support rails 112 and 116 define a plurality of openings configured to accept fasteners 510 to secure PV modules 114 to PV module support rails 112 and 116. As shown in FIG. 5A, fasteners 510 pass through the long side of the frames of PV modules 114. In various embodiments, fasteners 510 include components that establish an electrical grounding path between PV modules 114 and PV module support rails 112 and 116. Such components may include grounding washers that breach coatings (e.g., paint, reflective coatings 532 discussed in connection to FIG. 5D) to enable the grounding path to be established. Similarly, fasteners 512 may also include similar components that establish and electrical grounding path between PV modules 114 and blocking rails 118.

As shown in FIG. 5A, clamps 500 couple PV module support rails 112 to purlins 110. As shown in FIG. 5A, clamps 500 include a top portion 502 and one or more bottom portions 504. In various embodiments, top portions 502 are fastened to PV module support rails 112 and bottom portions 504 are coupled to purlins 110. As discussed in additional detail in reference to FIGS. 9A-9H, clamps 500 are not secured to purlins 110 by fasteners that pass through purlins 110 or by welding. In various embodiments, the top flange of purlins 110 do not define any openings at all. Instead, clamps 500 pinch a top flange of purlin 110 and are held by tension on fasteners that pass through top portions 502 and bottom portions 504. In such embodiments, the structural integrity of purlins 110 is not diminished by openings. Similarly, because clamps 500 attach PV module support rails 112 to purlins 110 by pinching the top flange and without fasteners having to pass through purlins 110, there is greater flexibility on where PV module support rails 112 can be attached. This allows for the variable spacing of PV module support rails 112 that is used for portrait orientation 130 mounting and landscape orientation 202 mounting without having to modify purlins 110. This avoids construction crews having to drill holes in purlins 110 in the field, which is difficult to accomplish properly, and also avoids the manufacturer of purlins 110 from having to pre-drill holes for both orientations. Additionally, this flexibility also allows for variations at the construction site to be mitigated (e.g., irregular spacing of columns 106 due to obstacles on or beneath mounting surface 102).

Similarly, because PV module support rails 112 are coupled to purlins 110 by clamps 500 and not weld points or fasteners, assembly and disassembly of the mounting structure is simplified. Columns of PV modules 114 may be removed together by disengaging clamps 500 and lifting PV module support rails 112 and 116 and PV modules 114 off of the mounting structure. Similarly, PV modules 114 may be attached to PV module support rails 112 and 116 on the ground and then a subassembly of PV module support rails 112 and 116 and PV modules 114 may be positioned on top of the mounting structure and secured using clamps 500. This may simplify initial construction, as well as enabling PV modules 114 to be replaced (e.g., replacing monofacial PV modules 114 with bifacial PV modules 114). As discussed in additional detail below in FIGS. 7A and 9A-9F, clamps 500 aid in establishing an electrical grounding path between PV module support rails 112 and purlins 110.

FIG. 5B is a top view of a set of PV modules 114 mounted in portrait orientation 130 on a set of three PV module support rails 112 and 116 in accordance with various embodiments. In FIG. 5B, purlins 110, PV module support rails 112 and 116, and gutter 302 are shown in dashed lines because they are obscured by PV modules 114. As can be seen on FIG. 5B, the long sides of PV modules 114 are parallel to and overlap PV modules support rails 112 and 116. In the embodiment shown in FIG. 5B, the long sides of frames of PV modules 114 lay on top of PV module support rails 112 and 116. Accordingly, PV module support rails 112 and 116 do not cause shadows across middle of the backside of PV modules 114, which increase the amount of reflected light 522 and ambient light 524 that can reach the back side of the PV module 114.

FIG. 5C is a cutaway side view of a PV module 114 mounted in portrait orientation 130 on a set of PV module support rails 112 in accordance with various embodiments. As shown in FIG. 5C, direct light 520 is received by the top of PV module 114 and reflected light 522 and ambient light 524 are received by the back of PV module 114. As shown in FIG. 5C, very little reflected light 522 and ambient light 524 is blocked by PV module support rails 112 because the PV module support rails 112 are parallel to and overlap with the long edges of the frames of PV modules 114. In embodiments in which PV module 114 is a bifacial PV module, this increase the amount of energy that can be generated.

FIG. 5D is a side view of a plurality of mounting structures 100 and a mounting surface 102 with reflective coatings 532 and 530, respectively in accordance with various embodiments. Direct light 520 shines from the sun to the tops of PV modules 114. Light that shines between mounting structures 100 is reflected by the reflective coating on mounting surface 102 as reflected light 522 and bounces back up to the backside of PV modules 114. Similarly, ambient light 524 bounces off of reflective coatings 530 and 532, and some of it reaches the back side of PV modules 114 as well. Additionally, in embodiments in which PV modules 114 have transparent back sheets and encapsulant, light that passes through the PV modules 114 can also bounce off of reflective coatings 530 and 532 reach the back side of PV modules 114.

In various embodiments, reflective coatings 530 for mounting surfaces 102 have reflectance values that range from 60% for light-colored coatings to 30% for dark-colored coating. In embodiments in which mounting surface 102 is concrete or asphalt, reflective coating 530 is formulated accordingly to adhere to the mounting surface 102. Similarly, reflective coatings 532 have reflectance values that range from 60% for light-colored coatings to 30% for dark-colored coating in various embodiments. As discussed above, the structural components of the mounting structure are made of metal of composite in various embodiments, and reflective coating 532 is formulated accordingly to adhere. Reflective coatings 530 and/or 532 may include materials such as spheres or flakes of materials like glass, glitter, or crystal that impart a reflective quality. In various embodiments, the columns 106, crossbeams 108, purlins 110, and PV module support rails 112 and 116 may be coated in reflective coating 532 during manufacturing, but in other embodiments may be painted in the field during construction. Similarly, mounting surface 102 and column foundations 104 may be painted with reflective coating 530 during construction of the mounting structure. In various embodiments, substantially all (e.g., 95% or more) of the mounting surface beneath and between mounting structures is painted with reflective coating 530 to maximize the amount of reflected light 522 and ambient light 524.

PV Modules Mounted in Landscape Orientation

FIGS. 6A-6C relate to embodiments in which PV modules 224 are mounted in landscape orientation 202. Referring now to FIG. 6A, a bottom perspective partially exploded view of the dual-tilt mounting structure 200 with PV modules 114 mounted in landscape orientation 202 is shown. As discussed herein, though, the mounting of PV modules 114 in landscape orientation 202 is not limited to mounting structure 200 and can be used on the single-tilt, shorter span, and/or longer span embodiments discussed above.

In FIG. 6A, a set of PV module support rails 112 and 116, PV modules 114, and blocking rails 118 are exploded of off purlins 110. Clamps 500 and fasteners 510 and 512 are also shown. As shown in FIG. 6A, clamps 500 are used to secure PV module support rails 112 to purlins 110, fasteners 510 are used to secure PV modules 114 to PV module support rails 112 and 116, and fasteners are used to secure blocking rails 118 to PV modules 114.

As shown in FIG. 6A and discussed previously, PV module support rails 112 and 116 are C beams in various embodiments. In contrast to FIG. 5A, in FIG. 6A, different sets of PV module support rails 112 and 116 are oriented differently. With PV module support rails 112A and 116A, a lateral side of the C beam faces the viewer and the open side of the C beam faces away from the viewer. With PV module support rails 112B and 116B, a lateral side of the C beam faces away from the viewer and the open side of the C beam faces the viewer. Thus, the open sides of the PV module support rails 112A and 116A shown exploded off purlins 110 face the open sides of PV module support rails 112B and 116B exploded off of purlins 110. Blocking rails 118 are disposed between the open sides of the PV module support rails 112A and 116A and PV module support rails 112B and 116B. In contrast to FIG. 5A, however, blocking rails 118 are not present between each PV module support rail 112 and 116. As shown in FIG. 6A, blocking rails 118, PV module support rails 112A and 116B, and PV module support rails 112B and 116B form a box, and PV modules 114 are coupled on top of the box by fasteners 510 and 512. The top surface of PV module support rails 112A, 11B and 116A, 116B define a plurality of openings configured to accept fasteners 510 to secure PV modules 114 to PV module support rails 112A, 112B and 116A, 116B. In contrast to FIG. 5A, in FIG. 6A, fasteners 510 pass through the short side of the frames of PV modules 114. In various embodiments, fasteners 510 includes components that establish an electrical grounding path between PV modules 114 and PV module support rails 112A, 112B and 116A, 116B. Such components may include grounding washers that breach coatings (e.g., paint, reflective coatings 532 discussed in connection to FIG. 5D) to enable the grounding path to be established. Similarly, fasteners 512 may also include similar components that establish and electrical grounding path between PV modules 114 and blocking rails 118.

As with FIG. 5A, clamps 500 attach PV module support rails 112A, 112B to purlins 110 without fasteners passing though purlins 110 or by weld points. Accordingly, an entire box of blocking rails 118, PV module support rails 112A and 116B, and PV module support rails 112B and 116B may be assembled on the ground, and PV modules 114 secured to PV module support rails 112A, 112B and 116A, 116B. Then, the entire subassembly may be lifted onto mounting structure 200 and secured with clamps 500. To remove and replace the PV modules, this operation would just need to be done in reverse.

FIG. 6B is a top view of a set of PV modules 114 mounted in landscape orientation 202 on a set of PV module support rails 112A, 112B, 116A, 116B in accordance with various embodiments. In FIG. 6B, purlins 110, PV module support rails 112A, 112B, 116A, and 116B, and gutter 302 are shown in dashed lines because they are obscured by PV modules 114. Additionally, a wire tray 600 is shown in dashed lines. Various embodiments of mounting structure 100, 200, etc. have wire trays 600 that are configured to support electrical wires connected to the PV modules 114 in various embodiments. As shown in FIG. 6B, PV module support rails 112A, 112B, 116A, and 116B cast shadows on the back side of PV modules 114. In embodiments with bifacial PV modules 114, such shadows might reduce power generation, but in embodiments with monofacial PV modules 114, shadows on the back of PV modules 114 will have little to no effect on power generation.

FIG. 6C is a cutaway side view of two monofacial PV modules 114 mounted in landscape orientation 202 on a set of PV module support rails 112A and 112B in accordance with various embodiments. In the embodiment shown in FIG. 6C, only direct light 520 is shown because the monofacial PV modules 114 only generate electricity on the top side.

Figure 7B:
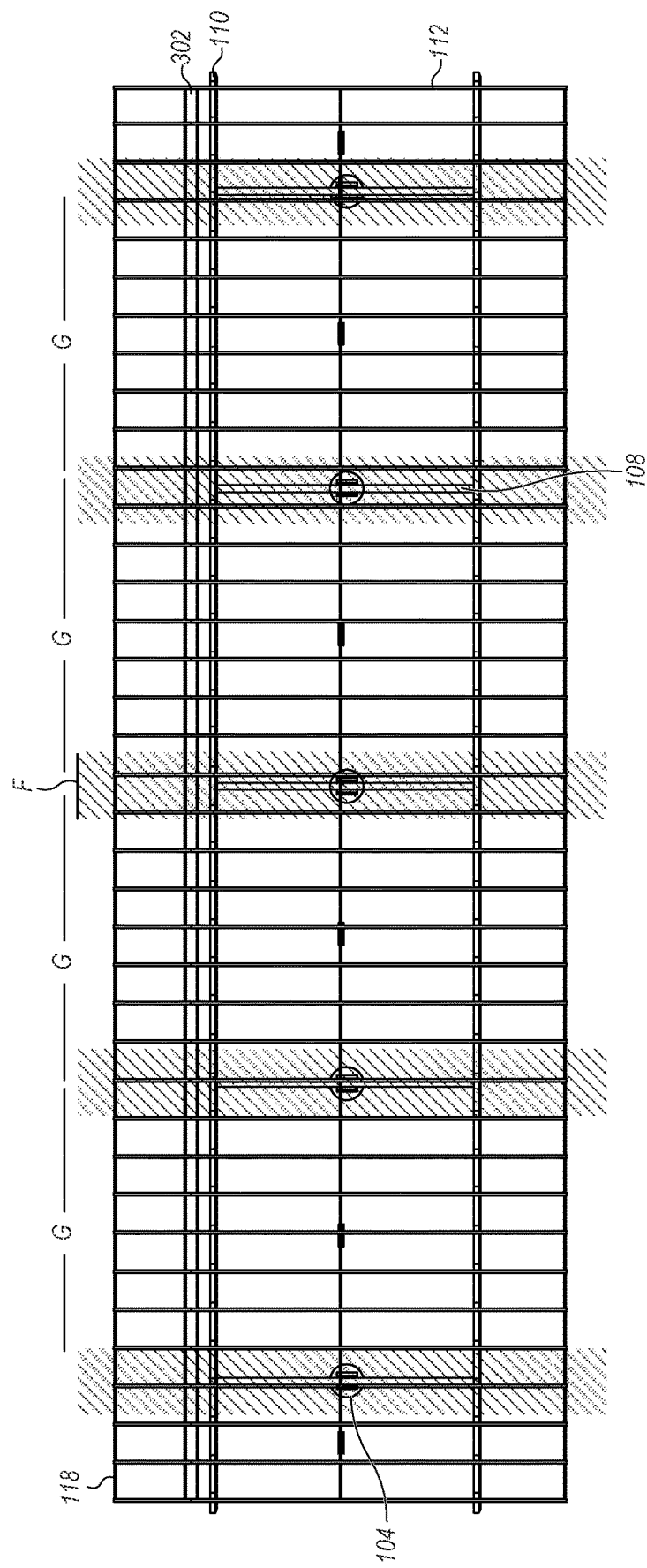
FIG. 7B is a top view of the dual-tilt mounting structure of FIG. 1 with the PV modules omitted in accordance with various embodiments.

Structural Support Components, Electrical Grounding, and Water Management Features of Various Mounting Structures FIGS. 7A-7C show different views of mounting structures with the PV modules 114 removed and focus on the "structural support components" of the mounting structures. As discussed here, the "structural support components" refers to the column foundation 104, columns 106, crossbeams 108, purlins 110, PV module support rails 112 and 116, and blocking rails 118 as well as the various fasteners and brackets that are used to couple these components together. As discussed above, in various embodiments, after column foundations 104 are installed in mounting surface 102, mounting structures described herein may be assembled using only fasteners, brackets, and clamps 500 and without any welding.

FIG. 7A is an exploded top view of a portion of dual-tilt mounting structure 100 with the PV modules 114 omitted in accordance with various embodiments. Column 106 is connected to crossbeam 108 by a plurality of fasteners 708 (four are shown in FIG. 7A but more or fewer could be used) that pass through a flat top portion 709 of column 106. Crossbeam 108 includes a reinforced portion 710 that is configured to receive fasteners 708 (e.g., with female screw thread installed in reinforced portion 710). In various embodiments, fasteners 708 are male threaded screws or bolts. Reinforced portion 710 is thicker than other portions of crossbeam 108.

Crossbeam 108 is coupled to purlins 110 using a pair of brackets 704. In the embodiment shown in FIG. 7A, brackets 704 are L-shaped brackets that are configured to receive a plurality of fasteners 706 on both sides of the L. While four fasteners 706 are shown in FIG. 7A, more or fewer fasteners could be used in various embodiments. In some embodiments, fasteners 706 pass though brackets 704 and into corresponding female threaded components embedded in crossbeam 108 and/or purlin 110. In other embodiments holes are drilled through crossbeam 108 and/or purlin 110 (either during manufacture or in the field) and fasteners are secured using nuts on the other side of crossbeam 108 and/or purlin 110. In various embodiments, fasteners 706 are male threaded screws or bolts. Thus, in various embodiments purlins 110 are coupled to side surfaces of the crossbeams 108 (i.e., as opposed to resting on top of the crossbeams 108 and being coupled to top flange 712). In various embodiments crossbeam 108 includes a top flange 712 with helps support the weight of PV module support rails 112 and PV modules 114, provides an attachment surface for clamp 500, and provides lateral support along the length of crossbeam 108. In various embodiments, crossbeam 108 defines a cutout 718 that is useable to run wires (e.g., wires for lighting installed in mounting structure 100, wires connected to PV modules 114) through mounting structure. In some embodiments, crossbeam 108 is coped (e.g., has a notch) such that the middle portion of the crossbeam has clearance to fit in a smaller middle section of purlin 110.

Purlins 110 are coupled to the PV module support rails 112 by clamps 500 that couple to top flange 740 of purlins 110 as discussed previously and in further detail in reference to FIGS. 9A-9H. Purlins 110 define a weight-reduction cutout 742 at the ends of purlins 110 in various embodiments.

As discussed previously, in various embodiments PV module support rails 112 and 116 are C beams. In such embodiments, PV module support rails 112 and 116 define a top surface 720, an intermediate surface 722, and a bottom surface 724. In such embodiments, top surface 720 define a series of holes (e.g., threaded holes, round and slotted punches) that are configured to receive fasteners 510. In various embodiments, such holes are formed during manufacturing, and the top surface 720 of PV module support rails 112 and 116 includes holes usable to accept fasteners 510 to couple PV modules 114 in portrait orientation 130 or landscape orientation 202 (i.e., top surface 720 defines sets of holes for both orientations and only one set is used). Intermediate surface 722 also defines sets of holes configured to accept fasteners (e.g., fasteners 940 shown in FIG. 9C) to couple top portion 502 of clamp 500 to the intermediate surface 722. Bottom surface 724 is configured to lie on top flange 740 when PV module support rails 112 are installed. In dual-tilt embodiments, PV module support rails 112 and 116 define holes 728 that are configured to receive fasteners that pass through bracket 702 to secure PV module support rails 116 to PV module support rails 112. In various embodiments, bracket 702 defines four holes: the top two holes are configured to receive fasteners that are received by holes 728 and the bottom two holes are configured to receive fasteners to secure gutter 302 (not shown in FIG. 7A) to bracket 702. Blocking rails 118 define a pair of holes 730 that are configured to receive fasteners that pass through PV module support rails 112 and 116 and into holes 730 to secure blocking rails 118 between pairs of PV module support rails 112 and 116.

In various embodiments, electrical grounding is facilitated by self-adhesive grounding patches 700 that are disposed between various structural support components. A self-adhesive grounding patch 700 is disposed between column 106 and crossbeam 108, and when fasteners 708 are tightened, the self-adhesive grounding patch 700 breaks through coatings (e.g., paint, anodization, or oxidation) on column 106 and crossbeam 108 and establishes an electrical grounding path. Similarly, self-adhesive grounding patches 700 are disposed between crossbeams 108 and purlins 110 such that when crossbeams 108 and purlins 110 are coupled using bracket 704 and fasteners 706, self-adhesive grounding patches 700 breaks through coatings (e.g., paint, anodization, or oxidation) on crossbeam 108 and purlins 110 and establishes an electrical grounding path. In various embodiments, self-adhesive grounding patches 700 are disposed between top portion 502 of clamp 500 and PV module support rails 112 such that self-adhesive grounding patches 700 breaks through coatings (e.g., paint, anodization, or oxidation) on PV module support rails 112 and clamp 500 and establishes an electrical grounding path. In some embodiments discussed in additional detail in references to FIGS. 9A-9H, bottom portion 504 is able to establish a grounding path between clamp 500 and purlin 110. In other embodiments, however, another set of self-adhesive grounding patches 700 are disposed between bottom portion 504 and purlin 110 to establish the grounding path. Finally, in some embodiments, self-adhesive grounding patches 700 are disposed between brackets 702 and PV module support rails 112 and/or 116. Accordingly, though the use of PV module support rails 112 and/or clamps 500, an electrical grounding path can be established between columns 106, crossbeams 108, purlins 110, and PV module support rails 112 and 116 as the structural support components are installed from the ground up. This may allow mounting structures as described herein to be grounded as it is being assembled and not after the PV modules 114 have been installed. This approach may reduce the risk of electrical shocks prior to grounding paths being established and allow non-electricians to establish the grounding path, which may subsequently be approved by electricians at lower labor cost.

FIG. 7B is a top view of the dual-tilt mounting structure 100 with the PV modules 114 omitted. Similarly, FIG. 7C is a top view of the dual-tilt mounting structure 200 with the PV modules 114 omitted. As shown in both FIGS. 7B and 7C, with both dual-tilt mounting structure 100 and dual-tilt mounting structure 200, column foundation 104 and columns 106 may be installed at the mounting surface 102 in a range labeled G. In various embodiments, this range can be about 3 feet (approximate 0.91 meters), with the column foundation 104 and columns 106 able to be installed anywhere within that 3-foot range. Moreover, column foundation 104 and columns 106 are separated by range F, which may range up to 36 feet (approximately 10.97 meters) in various embodiments. Thus, a first column foundation 104 and first column 106 may be 36 feet from a second column foundation 104 and second column 106, but a third column foundation 104 and third column 106 are only 34 feet from the second column foundation 104 and second column 106.

Accordingly, column foundation 104 and columns 106 may be irregularly spaced apart on mounting surface 102 to, for example, work around unexpected site conditions that were not known prior to installation. Additionally, referring to FIG. 7C, gaps 750 can be seen showing places in which blocking rails 118 are not installed between boxes of blocking rails 118, PV module support rails 112A and 116B, and PV module support rails 112B and 116B discussed previously. It will be understood that while FIGS. 7B and 7C show five crossbeams 108, mounting structures constructed according to the techniques described herein may be longer (i.e., having more crossbeams 108) or shorter (i.e., having fewer crossbeams).

Figure 8:
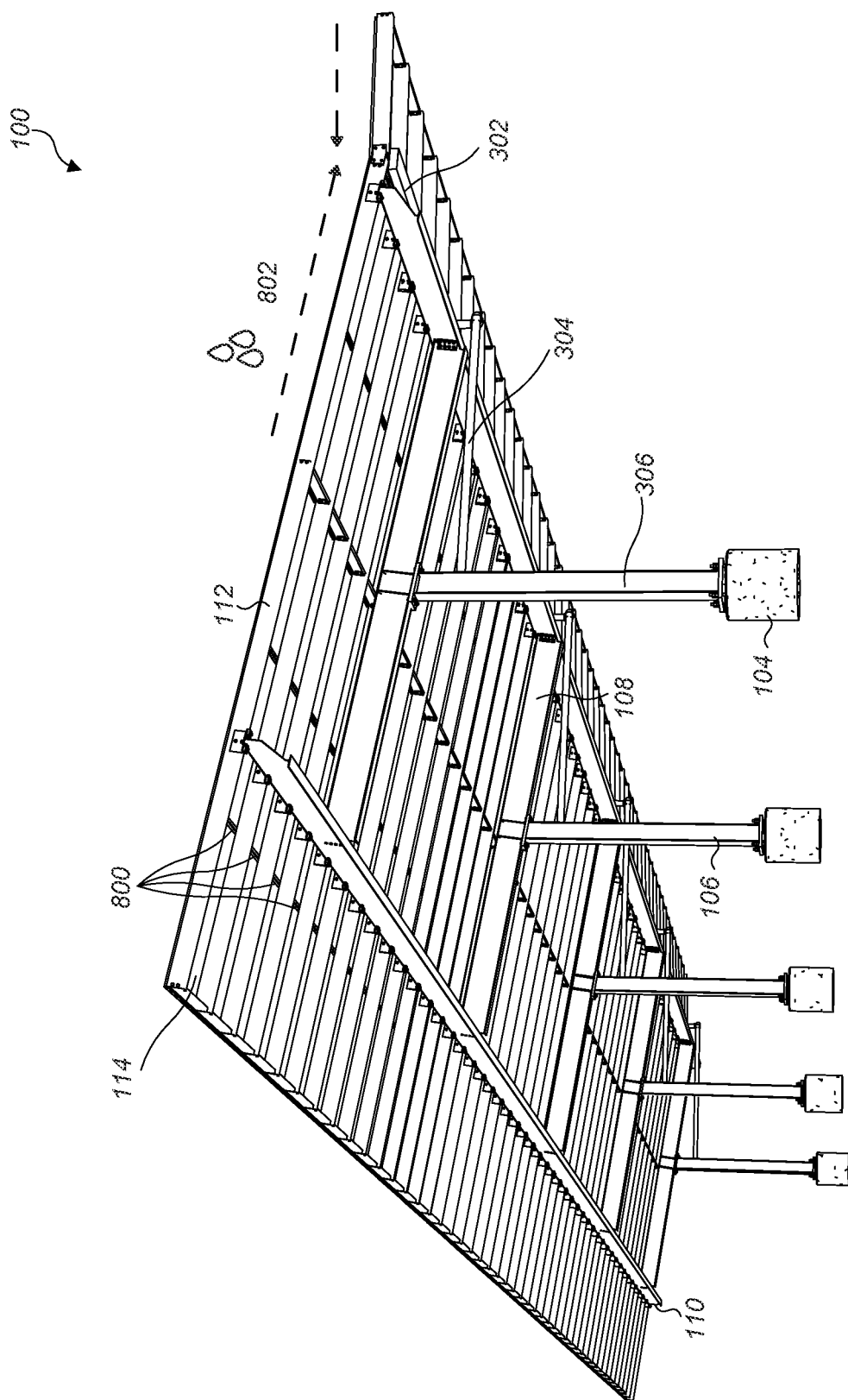
FIG. 8 is a bottom perspective view dual-tilt mounting structure of FIG. 1 with various water management features highlighted in accordance with various embodiments.

FIG. 8 is a bottom perspective view of dual-tilt mounting structure 100 with various water management features highlighted in accordance with various embodiments. In various embodiments, gaskets 800 are disposed between PV modules 114 that are installed in either landscape orientation 202 or portrait orientation 130. This causes water 802 to flow down the angled top surface of mounting structure 100 and into gutter 302. From gutter 302, water is able to flow through pipe 304 and into downspout 306. Thus, mounting structure 100 (and other dual-tilt mounting structure described herein) are able to shelter people and objects underneath from precipitation and move water away. In some embodiments, mounting structure 100 may have integrated heating elements (e.g., heating elements in PV module support rails 112 and 116) that prevent snow and ice from accumulating on PV modules 114.

Clamp

Figure 9C:
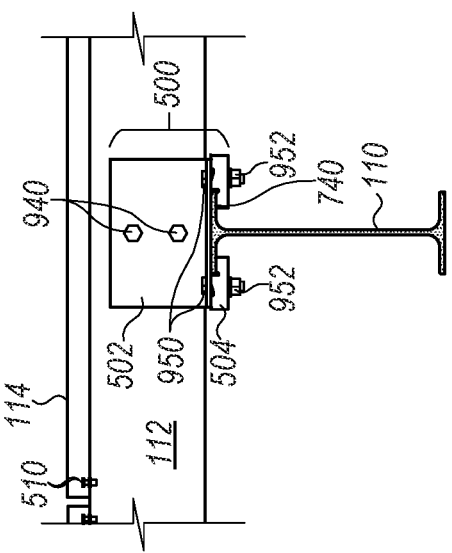
FIGS. 9C, 9E, and 9G are various views of the PV module support rail clamp of FIG. 9A installed with the top portion of the PV module support rail clamp secured to an outer surface of a PV support module support rail.
Figure 9D:
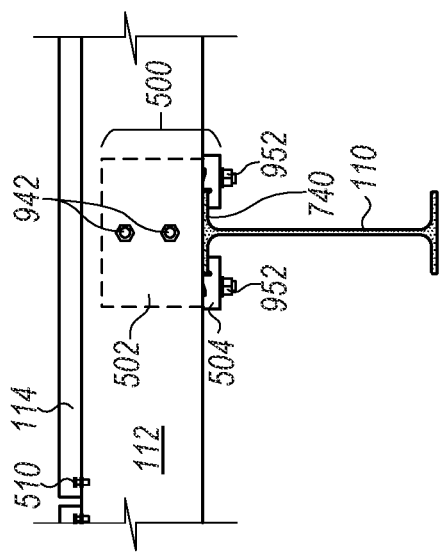
FIGS. 9D, 9F, and 9H are various views of the PV module support rail clamp of FIG. 9A installed with the top portion of the PV module support rail clamp secured to an inner surface of a PV support module support rail.
Figure 9A:
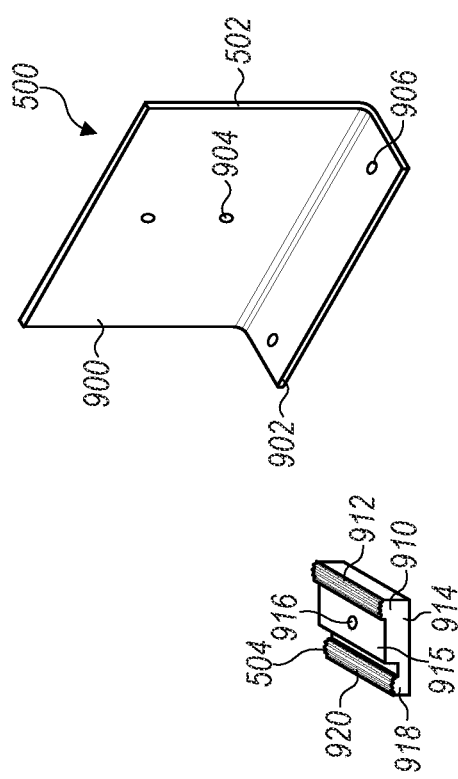
FIG. 9A is a perspective view of portions of the PV module support rail clamp of FIGS. 5A and 6A in accordance with various embodiments.

Referring now to FIGS. 9A-9H, various views of various embodiments of clamp 500 are shown. FIG. 9A is a perspective view of a top portion 502 and a bottom portion 504 of the clamp 500 shown in of FIGS. 5A, 6A, and 7A in accordance with various embodiments. Top portion 502 is an L-shaped bracket having a first top plate 900 that defines a pair of holes 904 and a second top plate 902 defines a pair of holes 906. When installed, first top plate 900 is configured to be adjacent to intermediate surface 722 of PV module support rails 112 and second top plate 902 is configured to lie on top flange 712 of purlin 110. In the embodiment shown in FIG. 9A, bottom portion 504 is a clamping jaw that defines a first portion 910 defining a rounded first top surface 912, a second portion 914 defining a flat second top surface 915 with a hole 916 configured to receive a clamping fastener 950, and a third portion 918 defining a rounded third top surface 920. When installed, the rounded first top surface 912 abuts top portion 502 and rounded third top surface 920 abuts the underside of the top flange 740 of purlin 110. In various embodiments, the rounded first top surface 912 is configured to breach one or more coatings on purlin 110 and establish a grounding path between clamp 500 and purlin 119.

Figure 9B:
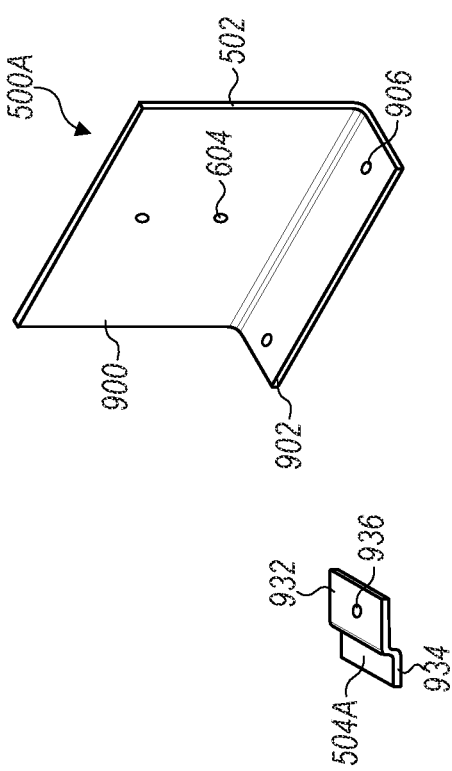
FIG. 9B is a perspective view of portions of an alternative PV module support rail clamp in accordance with various embodiments.

Referring now to FIG. 9B, a perspective view of a top portion 502 and an alternate bottom portion 504A of an alternative clamp 500A is shown. Alternative bottom portion 504A is S-shaped with a first portion 932 defining a hole 936 configured to receive clamping fastener 950 and a second portion 924. When installed, the first portion 932 abuts top portion 502 and second portion 934 abuts the underside of the top flange 740 of purlin 110. In the embodiment shown in FIG. 9A, a self-adhesive grounding patch 700 may be inserted between second portion 934 and the underside of top flange 740 of purlin 110. Alternatively, a self-adhesive grounding patch 700 may be inserted between second top plate 902 of top portion 502 and the top surface of top flange 740.

Figure 9E:
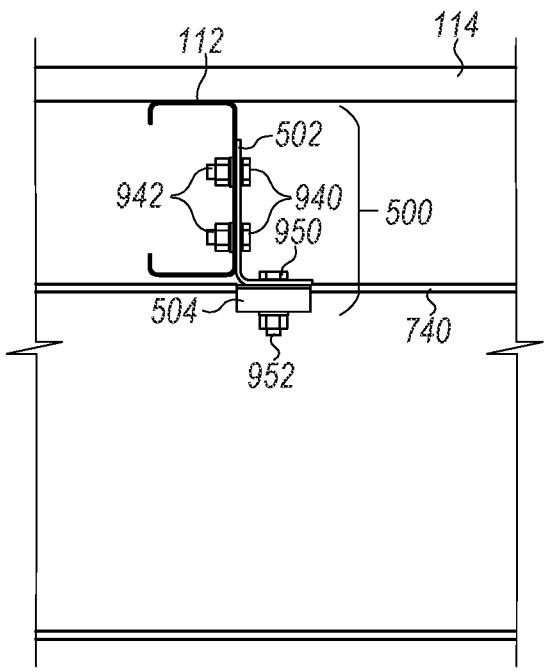
Figure 9F:
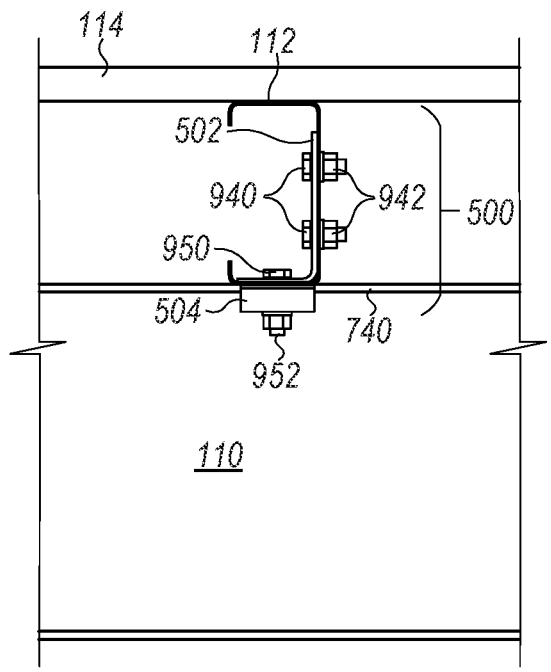
Figure 9G:
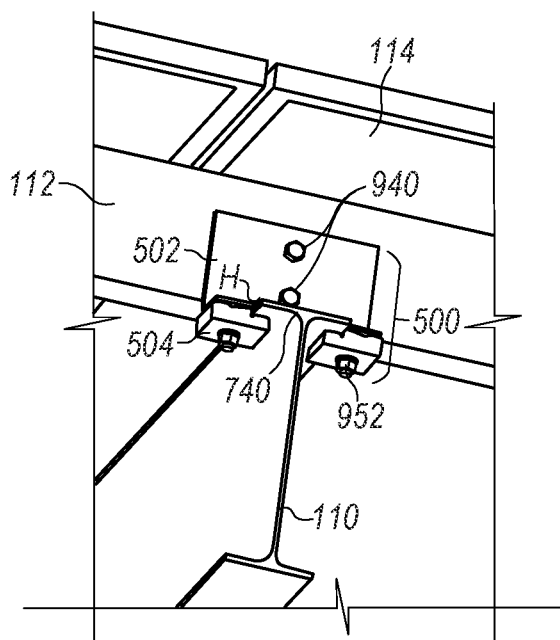
Figure 9H:
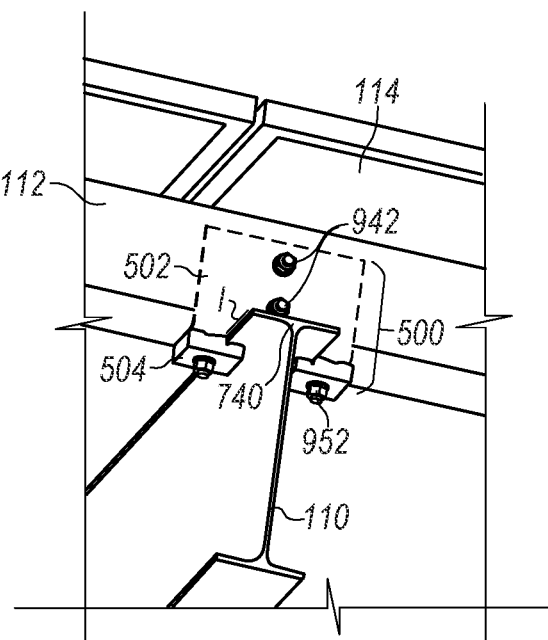

Referring now to FIGS. 9C-9H, various views of an installed clamp 500 are shown. FIGS. 9C, 9E, and 9G are various views of clamp 500 installed with the top portion 502 secured to an outer surface of a PV support module support rail 112. FIGS. 9D, 9F, and 9H are various views of clamp 500 installed with the top portion 502 secured to an inner surface of a PV support module support rail 112. As discussed herein, using clamp 500, PV support module support rail 112 are able to be secured to the mounting structure without welding and without having to pass fasteners through purlins 110.

Referring now to FIG. 9C, a side view of clamp 500 installed on a mounting structure is shown. In FIG. 9C, clamp 500 is installed with first top plate 900 secured to an outer surface of a PV support module support rail 112 by a pair of fasteners 940 (e.g., bolts) that extend through holes 905 and are secured by bolts 942 (see FIG. 9E). Second top plate 902 is secured to the top of top flange 740 of purlin 110. Two bottom portions 504 are disposed on the bottom side of top flange 740. Clamping fasteners 950 (e.g., a bolt) extends through holes 906 and holes 916 and is secured by nuts 952. Accordingly, tension on the clamping fasteners 950 secures second top plate 902 and bottom portions 504 to purlin 110 such that top flange 740 is pinched between. FIG. 9E is a cutaway side view showing clamp 500 installed on a mounting structure as described in reference to FIG. 9C. Similarly, FIG. 9G is a bottom perspective view showing clamp 500 installed on a mounting structure as described in reference to FIG. 9C. As can be seen in FIG. 9G, bottom portions 504 are disposed between the PV module support rail 112 and the end of purlin 110 at a distance H from the end of purlin 110.

Referring now to FIG. 9D, a side view of clamp 500 installed on a mounting structure in an alternative manner is shown. In FIG. 9C, clamp 500 is installed with first top plate 900 secured to an inner surface of a PV support module support rail 112 by a pair of fasteners 940 (e.g., bolts) that extend through holes 905 and are secured by bolts 942 (see FIG. 9F). Thus, in contrast to FIGS. 9C, 9E, and 9G, top portion 502 is disposed inside PV support module support rail 112 in some embodiments. Second top plate 902 is secured to the inside of bottom surface 724 of PV support module support rail 112.

Two bottom portions 504 are disposed on the bottom side of top flange 740. Clamping fasteners 950 (e.g., a bolt) extends through holes 906, holes through bottom surface 724 of PV support module support rail 112, and holes 916 and is secured by nuts 952. Accordingly, tension on the clamping fasteners 950 secures second top plate 902 and bottom portions 504 to purlin 110 such that bottom surface 724 and top flange 740 is pinched between. FIG. 9F is a cutaway side view showing clamp 500 installed on a mounting structure as described in reference to FIG. 9D. Similarly, FIG. 9H is a bottom perspective view showing clamp 500 installed on a mounting structure as described in reference to FIG. 9D. As can be seen in FIG. 9H, bottom portions 504 are disposed a further distance I from the end of purlin 110 compared to distance H in FIG. 9G. In the embodiment shown in FIGS. 9D, 9F, and 9H, bottom portions 504 are disposed beneath PV support module support rail 112.

Self-Adhesive Grounding Patch

Figure 10C:
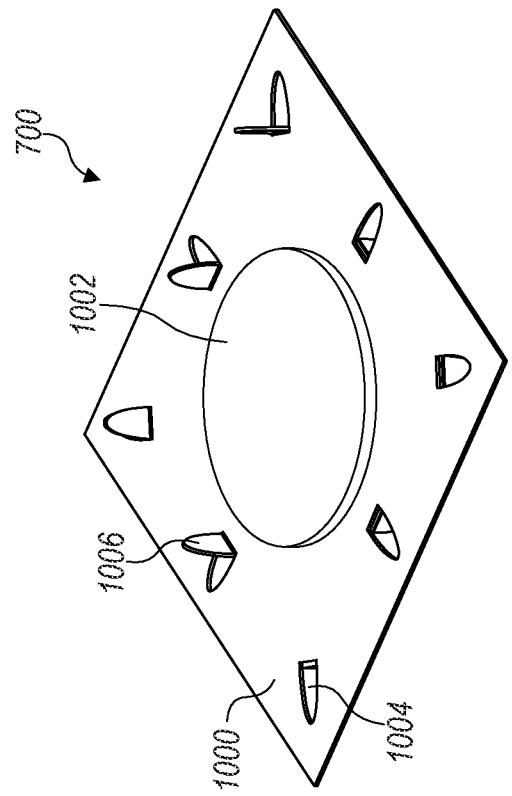
FIGS. 10A-10C are various views of the self-adhesive grounding patch of FIG. 7A in accordance with various embodiments.
Figure 10A:
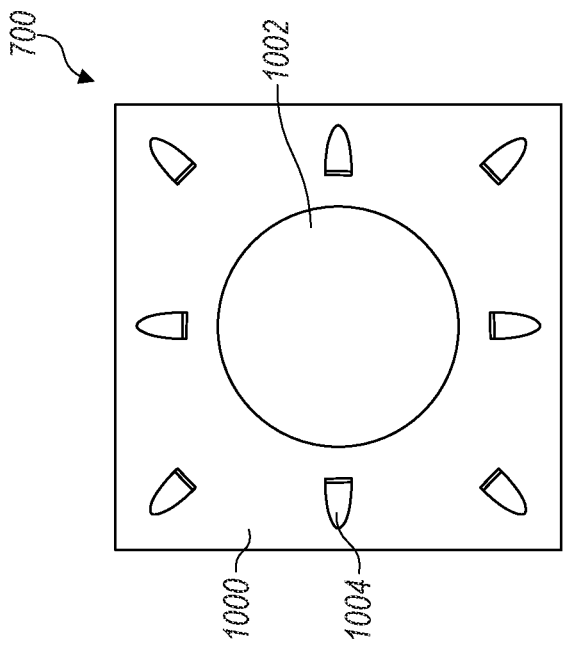
Figure 10B:
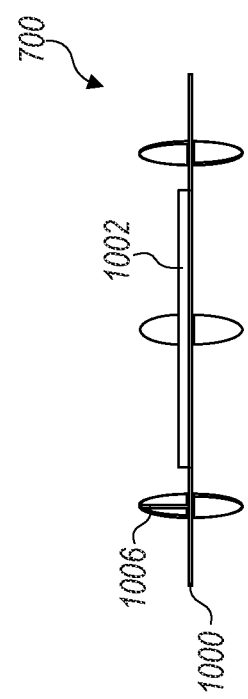

FIGS. 10A-10C are various views of the self-adhesive grounding patch 700 in accordance with various embodiments. FIG. 10A is a plan view of self-adhesive grounding patch 700. FIG. 10B is a side view of self-adhesive grounding patch 700. FIG. 10C is a top perspective view of self-adhesive grounding patch 700. In various embodiments, self-adhesive grounding patch 700 includes a plate 1000 with an adhesive pad 1002 disposed in the center. In various embodiments, plate 1000 is made of metal (e.g., stainless steel) and is a square with sides between 1 (approximately 2.54 centimeters) and 5 inches (approximately 12.7 centimeters) long. In various embodiments, adhesive pad 1002 is a peel and stick adhesive that is attached to plate 1000 during manufacture with a peelable top sheet that is removed prior to installation as discussed herein. Cutouts 1004 are arranged around adhesive pad 1002 and are bent above and below to form spikes 1006. In various embodiments, eight cutouts 1004 and spikes 1006 are present and are arranged on the sides and corners of plate 1000 as shown in FIGS. 10A-10, but other arrangements can be used (e.g., more cutouts and spikes may be present). Compressive forces on self-adhesive grounding patch 700 cause the spikes 1006 to penetrate coatings on components of the various mounting structure discussed herein, enabling an electrical grounding path to be established between adjacent components. Such compressive forces, for example, result from tension on the fasteners used to secure the structural support components as discussed herein.

Method of Constructing Various Embodiments of Mounting Structure

Figure 11:
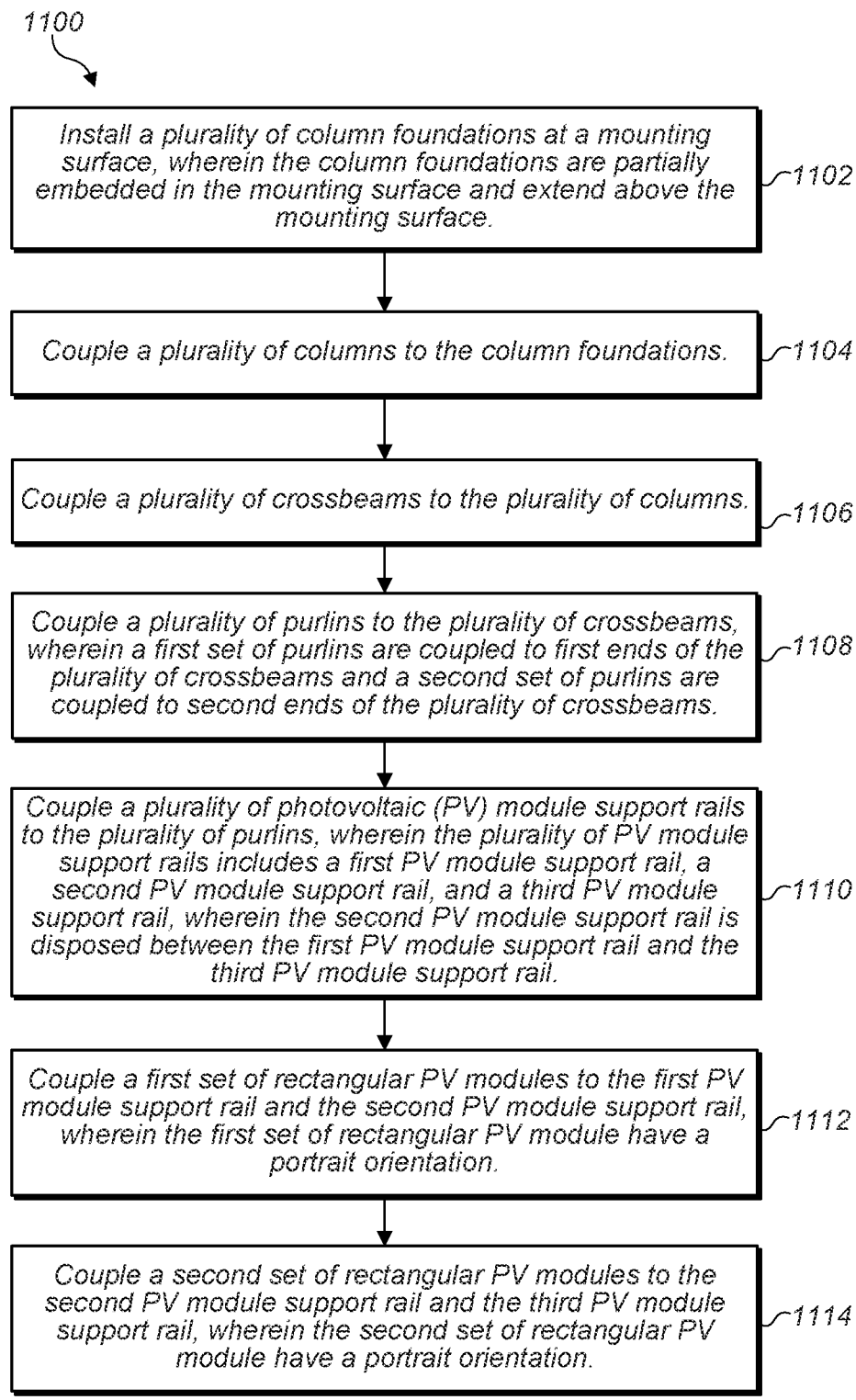
FIG. 11 is flowchart illustrating an embodiment of a PV module support structure construction method in accordance with various embodiments.

FIG. 11 is flowchart illustrating an embodiment of a PV module support structure construction method 1100 in accordance with various embodiments. In various embodiments, method 1100 is performed by construction personnel erecting a mounting structure (e.g., mounting structure 100, 200, etc.) on a mounting surface 102. While method 1100 proceeds upward from mounting surface 102, it will be understood that the sequence of these steps may be changed in various embodiments (e.g., securing PV modules 114 to PV module support rails 112 on the ground and then lifting the subassembly and installing it on purlins 110 as discussed herein).

A block 1102, a plurality of column foundations 104 are installed at a mounting surface 102 such that column foundations 104 are partially embedded in mounting surface 102 and extend above mounting surface 102. At block 1104, columns 106 are coupled to the column foundations 104. At block 1106, a plurality of crossbeams 108 are coupled to the plurality of columns 106. At block 1108, a plurality of purlins 110 are coupled to the plurality of crossbeams 108. A first set of purlins 110 are coupled to first ends of the plurality of crossbeams 108 and a second set of purlins 110 are coupled to second ends of the plurality of crossbeams. At block 1110, a plurality of PV module support rails 112 are coupled to the plurality of purlins 110. The plurality of PV module support rails 112 includes a first PV module support rail 112, a second PV module support rail 112, and a third PV module support rail 112. The second PV module support rail 112 is disposed between the first PV module support rail 112 and the third PV module support rail 112. At block 1112, a first set of PV modules 112 is coupled, in portrait orientation 130, to the first PV module support rail 112 and the second PV module support rail 112. At block 1114, a second set of PV modules 112 is coupled, in portrait orientation 130, to the second PV module support rail 112 and the third PV module support rail 112.

As discussed herein, in various embodiments, clamp 500 is used to perform the actions of block 1110. Further, in various embodiments, self-adhesive grounding patches 700 may be installed between the coupled components as part of performing the actions of blocks 1106, 1108, and/or 1110.

Figure 12:
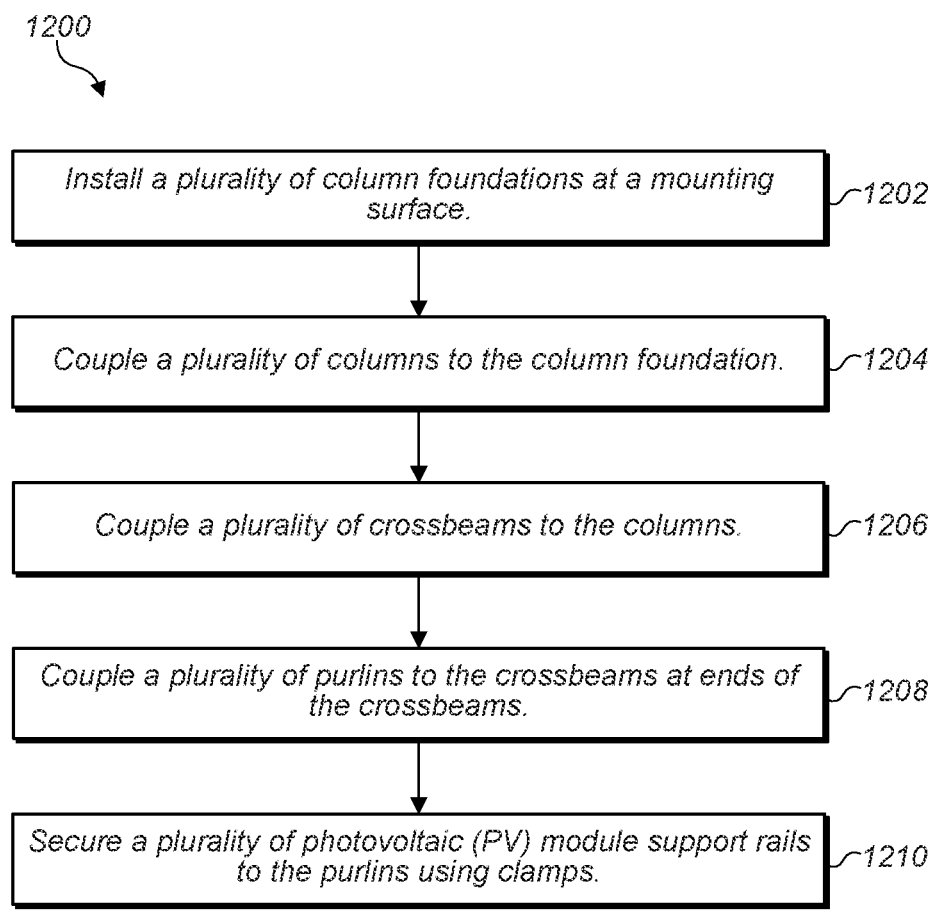
FIG. 12 is flowchart illustrating an embodiment of a PV module support structure construction method in accordance with various embodiments.

FIG. 12 is flowchart illustrating an embodiment of a PV module support structure construction method 1200 in accordance with various embodiments. In various embodiments, method 1200 is performed by construction personnel erecting a mounting structure (e.g., mounting structure 100, 200, etc.) on a mounting surface 102. While method 1100 proceeds upward from mounting surface 102, it will be understood that the sequence of these steps may be changed in various embodiments (e.g., securing PV modules 114 to PV module support rails 112 on the ground and then lifting the subassembly and installing it on purlins 110 as discussed herein).

At block 1202, a plurality of column foundation 104 are installed at a mounting surface 102. At block 1204, a plurality of columns 106 are coupled to the column foundations 104. At block 1206, a plurality of crossbeams 108 are coupled to the plurality of columns 106. At block 1208, a plurality of purlins 110 are coupled to the crossbeams 108 at ends of the crossbeams 108. At block 1210, a plurality of PV module support rails 112 are secured to purlins 110 using clamps 500.

As discussed herein, in various embodiments, PV modules 114 may be installed on top of PV module support rails 112 in portrait orientation 130 or landscape orientation 202. Further, clamp 500 may be disposed outside of PV module support rails 112 as shown in FIGS. 9C, 9E, and 9G or partially inside of PV module support rails 112 as shown in FIGS. 9D, 9F, and 9H. Further, in various embodiments, self-adhesive grounding patches 700 may be installed between the coupled components as part of performing the actions of blocks 1206, 1208, 1210, and/or 1210.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system comprising:
 a plurality of columns extending from a mounting surface along a first axis, wherein top ends of the plurality of columns are disposed above the mounting surface;
 a plurality of crossbeams coupled to the top ends of the plurality of columns and extending along a second axis, wherein individual crossbeams include a first end and an opposing second end;
 a plurality of purlins coupled to the plurality of crossbeams and extending along a third axis, wherein a first set of purlins are coupled to the first ends of the plurality of crossbeams and a second set of purlins are coupled to the second ends of the plurality of crossbeams;

a first plurality of photovoltaic (PV) module support rails extending along the second axis across the plurality of purlins, wherein individual PV module support rails include a bottom surface coupled to the plurality of purlins and a top surface defining a plurality of openings configured to accept fasteners at least one individual PV module support rail continuously spanning across a distance along the second axis of a top surface of at least one purlin coupled to the bottom surface of the at least one individual PV module support rail; and a plurality of rectangular PV modules secured to the top surfaces of the first plurality of PV module support rails by fasteners that extend through the rectangular PV modules and the openings configured to accept fasteners;

wherein the plurality of rectangular PV modules is disposed in portrait orientation in a first grid having columns extending along the second axis and rows extending along the third axis; and wherein a first set of rectangular PV modules in a first column and second set of rectangular PV modules in an adjacent second column are secured to a top surface of a same PV module support rail disposed between the first column and the second column.

2. The system of claim 1, wherein the columns, crossbeams, purlins, and PV module support rails are coated in a reflective coating.

3. The system of claim 1, wherein a portion of the mounting surface is coated in a reflective coating configured to reflect light toward the rectangular PV modules.

4. The system of claim 1, wherein the rectangular PV modules are bifacial PV modules.

5. The system of claim 1,
wherein the first grid defines a first plane;
wherein the system further comprises:
a second plurality of PV module support rails coupled to the first plurality of PV module support rails and extending along the second axis; and
a second plurality of rectangular PV modules secured to top surfaces of the second plurality of PV module support rails;

wherein the second plurality of rectangular PV modules are disposed in a portrait orientation in a second grid having columns extending along the second axis and rows extending along the third axis, wherein the columns of the first grid and the second grid are aligned and the rows of the first grid and the second grid are parallel; and wherein the second grid defines a second plane that intersects with the first plane.

6. The system of claim 1,
wherein a plurality of self-adhesive grounding patches is disposed between coupled columns and crossbeams and between coupled crossbeams and purlins; and
wherein an electrical grounding path is established between the column, the crossbeam, and the plurality of purlins.

7. The system of claim 1, wherein the first plurality of PV module support rails are secured to the plurality of purlins by respective clamps, wherein the clamps include:
an L-shaped bracket having a first portion that is secured to a given PV module support rail by one or more bracket fasteners and a second portion coupled to a given purlin;
one or more a clamping jaws coupled to a given top flange of the given purlin; and
a clamping fastener extending through the second portion and the clamping jaw, wherein tension on the clamping fastener secures the second portion of the L-shaped bracket and the clamping jaw to the given purlin.

8. The system of claim 7, further comprising:
a first set of self-adhesive grounding patches disposed between the L-shaped bracket and the given PV module support rails; and
a second set of self-adhesive grounding patches disposed between the clamping jaw and the given purlin;
wherein an electrical grounding path is established between the given PV module support rail and the given purlin.

9. The system of claim 1, wherein the purlins are coupled to side surfaces of the first and second ends of the crossbeams.

* * * * *